US012603260B2

(12) United States Patent
Kim et al.

(10) Patent No.: US 12,603,260 B2
(45) Date of Patent: Apr. 14, 2026

(54) APPARATUS FOR TREATING SUBSTRATE AND METHOD FOR TREATING SUBSTRATE

(71) Applicant: SEMES CO., LTD., Chungcheongnam-do (KR)

(72) Inventors: Dong Uk Kim, Gyeonggi-do (KR); In Hoe Kim, Seoul (KR); Hyoung Kyu Son, Seoul (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 594 days.

(21) Appl. No.: 17/976,996

(22) Filed: Oct. 31, 2022

(65) Prior Publication Data

US 2023/0133714 A1    May 4, 2023

(30) Foreign Application Priority Data

Nov. 1, 2021    (KR) ........................ 10-2021-0147841

(51) Int. Cl.
H01J 37/32        (2006.01)
C23C 14/56        (2006.01)
(Continued)

(52) U.S. Cl.
CPC ...... H01J 37/32743 (2013.01); C23C 14/568 (2013.01); C23C 16/54 (2013.01);
(Continued)

(58) Field of Classification Search
None
See application file for complete search history.

(56) References Cited

U.S. PATENT DOCUMENTS

| | | | | |
|---|---|---|---|---|
| 5,667,592 A | * | 9/1997 | Boitnott | ............ H01L 21/67196 |
| | | | | 204/298.25 |
| 9,576,824 B2 | * | 2/2017 | Lebouitz | ........... H01L 21/67063 |

(Continued)

FOREIGN PATENT DOCUMENTS

| | | |
|---|---|---|
| KR | 10-2277801 B1 | 7/2021 |
| KR | 10-2323167 B1 | 11/2021 |
| KR | 10-2022-0041013 A | 3/2022 |

OTHER PUBLICATIONS

Korean Office Action issued in corresponding KR Patent Application No. 10-2021-0147841, dated Apr. 29, 2025, with English translation.

*Primary Examiner* — Karla A Moore

(74) *Attorney, Agent, or Firm* — Carter, DeLuca & Farrell LLP

(57) ABSTRACT

The inventive concept provides a substrate treating apparatus. The substrate treating apparatus includes a chamber having an inner space; a separation unit provided at the inner space and configured to be combined with the chamber to divide the inner space into a plurality of treating spaces and a transfer space; a plurality of support units provided at each of the plurality of treating spaces and configured to support a substrate; a plurality of gas supply units provided at each of the plurality of treating spaces and configured to supply a process gas to the substrate supported on the plurality of support units; and a transfer unit provided at the transfer space and configured to transfer the substrate between the plurality of treating spaces.

13 Claims, 18 Drawing Sheets

(51) Int. Cl.
    *C23C 16/54*         (2006.01)
    *H10P 72/00*        (2026.01)

(52) U.S. Cl.
    CPC .... *H01J 37/32458* (2013.01); *H10P 72/0454*
        (2026.01); *H10P 72/0462* (2026.01); *H01J*
           *37/32522* (2013.01); *H01J 2237/201*
      (2013.01); *H01J 2237/20214* (2013.01); *H01J*
          *2237/20235* (2013.01); *H01J 2237/332*
          (2013.01); *H01J 2237/334* (2013.01)

(56)           References Cited

U.S. PATENT DOCUMENTS

| | | |
|---|---|---|
| 12,091,751 B2 | 9/2024 | Ohashi et al. |
| 2007/0051312 A1* | 3/2007 | Sneh ................. H01L 21/67748 |
| | | 156/345.31 |
| 2010/0275838 A1* | 11/2010 | Pei ........................ C23C 14/568 |
| | | 118/500 |

\* cited by examiner

APPARATUS FOR TREATING SUBSTRATE AND METHOD FOR TREATING SUBSTRATE

CROSS-REFERENCE TO RELATED APPLICATIONS

A claim for priority under 35 U.S.C. § 119 is made to Korean Patent Application No. 10-2021-0147841 filed on Nov. 1, 2021, in the Korean Intellectual Property Office, the entire contents of which are hereby incorporated by reference.

BACKGROUND

Embodiments of the inventive concept described herein relate to a substrate treating apparatus and a substrate treating method.

In general, a semiconductor element is manufactured by repeatedly performing a series of processing processes on a silicon wafer used as a substrate. For example, a deposition process for forming a thin film on the substrate, a photolithography process for forming a photoresist pattern on the thin film, and an etching process for patterning or removing the thin film may be performed.

Recently, the semiconductor element is pursuing a high integration, and for a high integration of semiconductor elements, it is required to form a pattern having a high aspect ratio (HAR). In order to form the pattern having the high aspect ratio, a method of forming the pattern by combining a deposition process and an etching process is known. In the case of a pattern formation process by combining the deposition process and the etching process, a process temperature of each process is different from each other, and accordingly, there is a device problem of a process for performing the deposition process and the etching process.

In an embodiment, in the case of a deposition-etching composite process using a same substrate support unit in one chamber, a temperature of the chamber or substrate support unit must be converted to a process temperature of a process every time each process is performed. At this time, there is a problem that parts inside the chamber are damaged by a heat shock due to a temperature conversion, and the usage life of the parts in the chamber or the chamber is reduced accordingly. In addition, if the temperature is converted, there is a problem that contaminants such as particles are generated due to a condensation of a gas remaining in an inner space of the chamber, and as a result, the substrate is contaminated. In addition, there is a problem in that a process time increases due to a time required for a temperature conversion and a stabilization.

As another example, in the case of a multi-stage type which treats multiple substrates in one chamber, there is a problem in that a robot transferring the substrate inside the chamber is contaminated and the contaminants generated by the robot are contaminated.

As another example, it a deposition chamber in which a deposition process is performed and an etching chamber in which an etching process is performed are separately configured, the temperature conversion is not required. However, the chamber is opened to transfer the substrate between the deposition chamber and the etching chamber, and thereby an environment inside the chamber changes, making it difficult to maintain optimal process conditions. In addition, in the case of the substrate treating apparatus having a separate deposition chamber and an etching chamber, the apparatus device is larger than the apparatus of the aforementioned embodiment or the aforementioned other embodiment, which is disadvantageous in terms of space utilization.

SUMMARY

Embodiments of the inventive concept provide a substrate treating apparatus and a substrate treating method for effectively treating a substrate.

Embodiments of the inventive concept provide a substrate treating apparatus and a substrate treating method for providing a substrate having a feature of a high aspect ratio by combining a deposition process and an etching process.

Embodiments of the inventive concept provide a substrate treating apparatus and a substrate treating method for simultaneously performing a deposition process and an etching process.

The technical objectives of the inventive concept are not limited to the above-mentioned ones, and the other unmentioned technical objects will become apparent to those skilled in the art from the following description.

The inventive concept provides a substrate treating apparatus. The substrate treating apparatus includes a chamber having an inner space; a separation unit provided at the inner space and configured to be combined with the chamber to divide the inner space into a plurality of treating spaces and a transfer space; a plurality of support units provided at each of the plurality of treating spaces and configured to support a substrate; a plurality of gas supply units provided at each of the plurality of treating spaces and configured to supply a process gas to the substrate supported on the plurality of support units; and a transfer unit provided at the transfer space and configured to transfer the substrate between the plurality of treating spaces.

In an embodiment, the chamber includes: a top wall; a bottom wall positioned opposite the top wall; a plurality of side walls connecting the top wall and the bottom wall; a protruding wall which upwardly protrudes from the bottom wall; and a plurality of partition walls, and wherein the separation unit includes: a top plate; a plurality of side plates downwardly extending from an edge of an outer side of the top plate; and a separation plate downwardly extending from the top plate, and wherein the separation plate of the separation unit faces the partition wall, and the side plate of the separation unit wall faces the protruding wall of the chamber.

In an embodiment, the separation unit is provided to be movable in an up/down direction within the inner space, and the separation unit is movable between a contact position in which the separation plate of the separation unit contacts the partition wall of the chamber and a separation position which separates the separation plate of the separation unit from the partition wall of the chamber.

In an embodiment, the separation unit separates the inner space into the plurality of treating spaces and the transfer space at the contact position.

In an embodiment, the side plate of the separation unit includes a first to a fourth side plate which are adjacent to each other, and wherein the separation plate of the separation unit includes: a first separation plate having an end which combines with the first side plate; a second separation plate having an end which combines with the second side plate and the other end which combines with the other end of the first separation plate; a third separation plate having an end which combines with the third side plate; and a fourth separation plate having an end which combines with the second plate and the other which combines with the other end of the third separation plate, and which is spaced apart from the second separation plate, and wherein the plurality of treating spaces includes a first treating space and a second treating space which are spaced apart, and wherein the first treating space is formed in a combination of the first side plate, the second side plate, the first separation plate, and the second separation plate, and the second treating space is formed in a combination of the second side plate, the third side plate, the third separation plate, and the fourth separation plate.

In an embodiment, different substrate treatment processes are performed at the first treating space and the second treating space, and wherein any one process among a deposition process and an etching process is performed at the first treating space, and the other one process among the deposition process and the etching process is performed at the second treating space.

In an embodiment, the first treating space and the second treating space are positioned to be provided alternately.

In an embodiment, a plurality of substrates are taken into the plurality of treating spaces, and different substrate treatment processes are simultaneously performed at the plurality of treating spaces.

In an embodiment, the separation unit includes the top plate, a purge gas supply line embedded in the side plate and the separation plate, and a gas supply source for supplying a purge gas to the purge gas supply line, and wherein a discharge port of the purge gas supply line is formed at an end of the side plate and an end of the separation plate, and wherein an air curtain is formed by a supply of the purge gas from the discharge port, if the separation plate is positioned at the separation position.

In an embodiment, the separation plate of the separation unit includes: a fifth separation plate having an end which combines with the third side plate and is spaced apart from the third separation plate; a sixth separation plate having an end which combines with the fourth side plate and having the other end combining with the other end of the fifth separation plate; a seventh separation plate having an end which combines with the first side plate and is spaced apart from the first separation plate; and an eighth separation plate having an end which combines with the fourth side plate and having the other end combining with the other end of the seventh plate, and which is spaced apart from the sixth separation plate, and wherein the plurality of treating spaces further comprise a third treating space which is formed by the third side plate, the fourth side plate, the fifth separation plate, and the sixth separation plate, and a fourth treating space which is formed by the fourth side plate, the first side plate, the seventh separation plate, and the eighth separation plate.

In an embodiment, the transfer space is formed between the plurality of treating spaces, and the transfer space transfers a substrate which has been treated in each of the plurality of treating spaces in a state at which the separation unit is positioned in the separation position to another treating space in a clockwise direction or in a counter clockwise direction.

In an embodiment, the plurality of treating spaces includes four treating spaces or six treating spaces, and the transfer space is formed between the plurality of treating spaces.

In an embodiment, processes having a different process temperature from each other are simultaneously performed at the plurality of treating spaces.

In an embodiment, the transfer unit includes: a central part at which a rotation shaft is combined; and a plurality of arms which extend from the central part to an outside and which support the substrate, and wherein the plurality of arms are provided in a number corresponding to the plurality of treating spaces.

The inventive concept provides a substrate treating method for performing a deposition process and an etching process alternatively while a substrate is sequentially moved through a plurality of treating spaces, at which the deposition process and the etching process is performed simultaneously in one chamber, and the chamber is provided between a plurality of treating spaces which are separated from each other and a plurality of treating spaces and includes a transfer space which has a transfer unit configured to transfer the substrate between the plurality of treating spaces. The substrate treating method includes a depositing which is performed at a portion of the plurality of treating spaces; and an etching which is performed at a remaining portion of the plurality of treating spaces, and wherein a treating space at which the depositing is performed and a treating space at which the etching is performed is positioned in turns, and a substrate on which the depositing has been performed is transferred to the treating space at which the etching is performed by the transfer unit, and a substrate on which the etching has been performed is transferred to the treating space at which the depositing is performed by the transfer unit.

In an embodiment, the chamber is separated into the plurality of treating spaces and the transfer space by the separation unit, and wherein the separation unit is movable in an up/down direction.

In an embodiment, the separation unit moves between a contact position which contacts the chamber to close each of the plurality of treating spaces, the plurality of treating spaces, and the transfer space, and a separation position which is spaced apart from the chamber to open the plurality of treating spaces and the transfer space, and a process is performed on the substrate if the separation unit is positioned at the contact position, and the transfer unit transfers the substrate if the separation unit is positioned at the separation position.

In an embodiment, the separation unit comprises a purge gas supply unit embedded in the separation plate, and a gas supply source for supplying a purge gas to the purge gas supply line, and an air curtain is formed by a supply of the purge gas from the separation unit, if the separation unit is positioned at the separation position.

In an embodiment, a process temperature of the depositing and the etching are different from each other.

In an embodiment, the plurality of treating spaces are provided in an even number.

The inventive concept provides a substrate treating apparatus. The substrate treating apparatus includes a chamber having an inner space; a separation unit provided at the inner space and configured to be combined with the chamber to divide the inner space into a plurality of treating spaces and a transfer space; a plurality of support units provided at each of the plurality of treating spaces and configured to support a substrate; a plurality of gas supply units provided at each of the plurality of treating spaces and configured to supply a process gas to the substrate supported on the plurality of support units; and a transfer unit provided at the transfer space and configured to transfer the substrate between the plurality of treating spaces, and wherein the separation unit is provided to be movable between a contact position in which the separation unit contacts the chamber in the inner space and a separation position in which the separation unit is spaced apart from the chamber, the separation unit divides the plurality of treating spaces and the transfer space by a contact of the separation unit and the chamber if the separation unit is positioned in the contact position, and forms an air curtain to separation the plurality of treating spaces and the transfer space if the separation unit is positioned in the separation position.

In an embodiment, a portion of the plurality of treating spaces are provided as a treating space in which a deposition process is performed, and the remaining portion of the plurality of treating spaces are provided as a treating space in which an etching process is performed, and the treating space in which the deposition process is performed and the treating space in which the etching process is formed are positioned in turns.

According to an embodiment of the inventive concept, a substrate may be effectively treated.

According to an embodiment of the inventive concept, a substrate having a feature of a high aspect ratio may be efficiently treated by combining a deposition process and an etching process.

According to an embodiment of the inventive concept, a deposition-etching combination process may be possible in the same chamber without a temperature change by dividing a region for performing a deposition process and a region for performing an etching process.

According to an embodiment of the inventive concept, a deposition and an etching process may be independently and simultaneously performed within the same chamber.

According to an embodiment of the inventive concept, a possibility of a contamination due to a robot may be minimized by positioning the robot for moving a substrate within the same chamber in a separate region.

The effects of the inventive concept are not limited to the above-mentioned ones, and the other unmentioned effects will become apparent to those skilled in the art from the following description.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
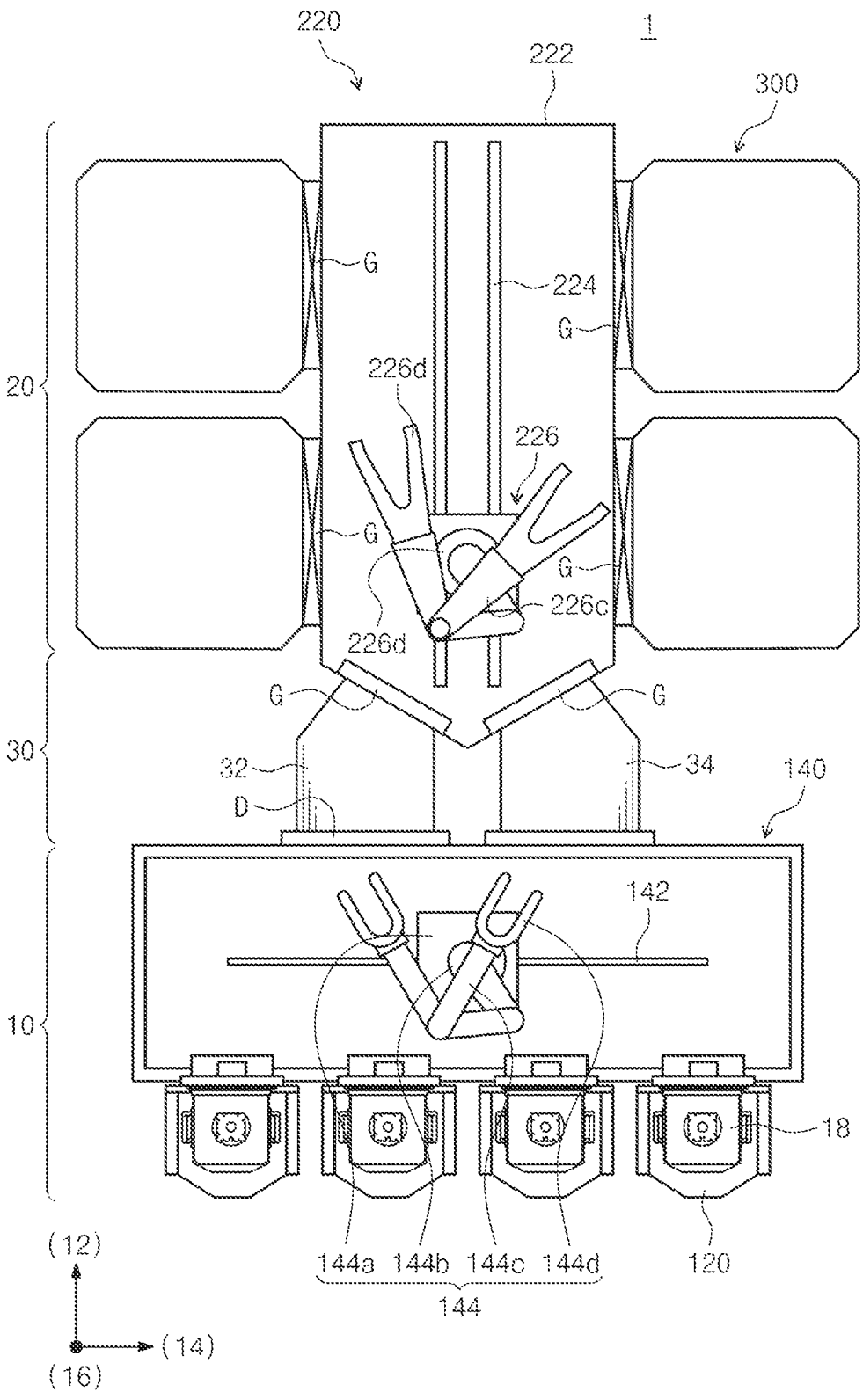
FIG. 1 is a plan view illustrating a substrate treating facility according to an embodiment of the inventive concept.

The inventive concept may be variously modified and may have various forms, and specific embodiments thereof will be illustrated in the drawings and described in detail. However, the embodiments according to the concept of the inventive concept are not intended to limit the specific disclosed forms, and it should be understood that the present inventive concept includes all transforms, equivalents, and replacements included in the spirit and technical scope of the inventive concept. In a description of the inventive concept, a detailed description of related known technologies may be omitted when it may make the essence of the inventive concept unclear.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Hereinafter, embodiments of the inventive concept will be described in detail with reference to the accompanying drawings.

In an embodiment of the inventive concept, a process of treating the substrate W using a plasma or a gas other than the plasma will be described as an example. According to an embodiment of the inventive concept, a process of treating the substrate W by repeatedly performing a deposition process and an etching process will be described as an example. However, an embodiment of the inventive concept is not limited to this, and can be applied in various ways to a substrate treatment process using a liquid such as a cleaning process, an ashing process, and a developing process.

Here, the substrate is a comprehensive concept which includes both a semiconductor element, a flat panel display (FPD), and other substrates used to manufacture objects with a circuit pattern formed on a thin film. Examples of such substrates W include silicon wafers, glass substrates, and organic substrates.

Hereinafter, an embodiment of the inventive concept will be described in detail with reference to FIG. 1 to FIG. 18.

FIG. 1 is a plan view illustrating a substrate treating facility according to an embodiment of the inventive concept. Referring to FIG. 1, the substrate treating facility 1 may include an index module 10, a treating module 20, and a load lock module 30.

The index module 10 may include a load port 120 and a transfer frame 140. The load port 120, the transfer frame 140, the load lock module 30, and the treating module 20 may be sequentially arranged in a direction. Hereinafter, a direction in which the load port 120, the transfer frame 140, the load lock module 30, and the treating module 20 are arranged is referred to as a first direction 12, a direction perpendicular to the first direction 12 is referred to as a second direction 14, and a direction perpendicular to a plane including both the first direction 12 and the second direction 14 is referred to as a third direction 16. The third direction 16 may be a direction perpendicular to both the first direction 12 and the second direction 14.

A cassette 18 in which a plurality of substrates W are stored may be mounted on the load port 120. A plurality of load ports 120 may be provided. The plurality of load ports 120 may be arranged in a direction along the second direction 14. The plurality of load ports 120 may be disposed to be spaced apart from each other in the second direction 14. Although FIG. 1 illustrates that four load ports 120 are provided, the inventive concept is not limited thereto, and the number of load ports 120 may increase or decrease according to conditions such as a processing efficiency and a footprint of the treating module 20.

A slot (not shown) supporting an edge region of the substrate W may be formed in the cassette 18. The slot may include a plurality of slots. The plurality of slots may be formed to be spaced apart from each other along the third direction 16. A plurality of substrates W are supported on the plurality of slots, in which case the plurality of substrates W may be placed in the cassette 18 to be stacked in a state spaced apart from each other along the third direction 16. A front opening unified pod (FOUP) may be used as the cassette 18.

The transfer frame 140 transfers the substrate W between the cassette 18 mounted on the load port 120 and the load lock module 30. The transfer frame 140 may be arranged in the first direction 12 with the load port 120. The transfer frame 140 may be disposed between the load port 120 and the load lock module 30. The transfer frame 140 may be provided with an index rail 142 and an index robot 144. A lengthwise direction of the index rail 142 may be formed parallel to the second direction 14. The index robot 144 may be installed on the index rail 142. The index robot 144 may be provided to be movable on the index rail 142. The index robot 144 may be provided to be linearly moved in the second direction 14 along the index rail 142. The index robot 144 may include a base 144a, a body 144b, an index arm 144c, and a hand 144d. The base 144a may be installed to be movable along the index rail 142. The body 144b may be coupled to the base 144a. The body 144b may be provided to be movable along the third direction 16 on the base 144a. The body 144b may be rotatably provided on the base 144a. The index arm 144c may be coupled to the body 144b. The index arm 144c may be provided to be forwardly and backwardly movable with respect to the body 144b. The index arm 144c may include a plurality of index arms 144c. The plurality of index arms 144c may be individually driven. The plurality of index arms 144c may be stacked in a state of being spaced apart from each other along the third direction 16. Some of the plurality of index arms 144c may be used when the substrate W is transferred from the treating module 20 to the cassette 18. The others among the plurality of index arms 144c may be used when the substrate W is transferred from the cassette 18 to the treating module 20. In this case, particles generated from the substrate W before a treatment can be prevented from being attached to the substrate W after the treatment in a process of bringing in or taking out the substrate W by the index robot 144.

The load lock module 30 can switch an inner atmosphere of the load lock module 30 between an atmospheric pressure atmosphere and a vacuum atmosphere to transfer the substrate W between the transfer frame 140 and the transfer unit 220. The load lock module 30 may convert the atmospheric pressure atmosphere of the index module 10 into the vacuum atmosphere of the treating module 20 or the vacuum atmosphere of the treating module 20 into the atmospheric pressure atmosphere of the index module 10. It may be disposed between the transfer frame 140 and the transfer unit 220. A door (not shown) for opening and closing an opening through which the substrate W is transferred may be installed between the load lock module 30 and the transfer frame 140. A gate valve (not shown) for opening and closing the opening to which the substrate W is transferred may be installed between the load lock module 30 and the transfer unit 220. The load lock module 30 may provide a space in which the substrate W remains before the substrate W is transferred between the transfer frame 140 and the transfer unit 220. The load lock module 30 may include a load lock chamber 32 and an unload lock chamber 34.

The load lock chamber 32 may provide a space in which the substrate W transferred from the index module 10 to the treating module 20 temporarily remains. Before the substrate W is taken into the load lock chamber 32 from the index module 10, the load lock chamber 32 may maintain the atmospheric pressure atmosphere. In this case, the load lock chamber 32 may be maintained in an open state with respect to the index module 10 and may be blocked with respect to the treating module 20. That is, the door between the load lock chamber 32 and the index module 10 is opened, and the gate valve between the load lock chamber 32 and the transfer unit 220 may be maintained in a closed state. If the substrate W is taken into the load lock chamber 32, an inner space of the load lock chamber 32 may be sealed with respect to each of the index module 10 and the treating module 20. That is, the door between the load lock chamber 32 and the index module 10 and the gate valve between the load lock chamber 32 and the transfer unit 220 may all remain closed. Thereafter, the inner space of the load lock chamber 32 may be converted from the atmospheric pressure atmosphere to the vacuum atmosphere. Thereafter, the load lock chamber 32 may be opened with respect to the treating module 20 in a state of being blocked with respect to the index module 10. That is, the door between the load lock chamber 32 and the index module 10 may be closed, and the gate valve between the load lock chamber 32 and the transfer unit 220 may be opened.

The unload lock chamber 34 may provide a space in which the substrate W transferred from the treating module 20 to the index module 10 temporarily remains. Before the substrate W is taken into the unload lock chamber 34 from the treating module 20, the unload lock chamber 34 may maintain the vacuum atmosphere. In this case, the unload lock chamber 34 may remain open with respect to the treating module 20 and may be blocked with respect to the index module 10. That is, the gate valve between the unload lock chamber 34 and the transfer unit 220 may be opened, and the door between the unload lock chamber 34 and the index module 10 may be maintained in a closed state. If the substrate W is taken into the unload lock chamber 34, the inner space of the unload lock chamber 34 may be sealed with respect to each of the index module 10 and the treating module 20. That is, the door between the unload lock chamber 34 and the index module 10 and the gate valve between the unload lock chamber 34 and the transfer unit 220 may all remain closed. Thereafter, the inner space of the unload lock chamber 34 may be converted from the vacuum atmosphere to the atmospheric pressure atmosphere. Thereafter, the unload lock chamber 34 may be opened with respect to the index module 10 in a state of being blocked with respect to the treating module 20. That is, the door between the unload lock chamber 34 and the index module 10 may be opened, and the gate valve between the unload lock chamber 34 and the transfer unit 220 may be closed.

The treating module 20 may include a transfer unit 220 and a substrate treating apparatus 300.

The transfer unit 220 may transfer the substrate W between the load lock chamber 32, the unload lock chamber 34, and a plurality of substrate treating apparatuses 300.

The transfer unit 220 may include a transfer chamber 222. The transfer chamber 222 may have a rectangular cross section. However, the inventive concept is not limited thereto, and the transfer chamber 222 may have various shapes including a polygonal shape such as a pentagon or a hexagon in a cross section. According to the shape of the transfer chamber 222, the substrate treating facility 1 may be classified into a linear type or a cluster type. That is, the substrate treating facility 1 according to an embodiment of the inventive concept may be provided in a linear type or a cluster type.

The transfer unit 220 may be provided with a transfer rail 224 and a transfer robot 226. The transfer rail 224 may be formed in a lengthwise direction parallel to the first direction 12. The transfer robot 226 may be installed on the transfer rail 224. The transfer robot 226 may be provided to be movable along the transfer rail 224. The transfer robot 226 may be provided to move linearly in the first direction 12 along the transfer rail 224. The transfer robot 226 may include a base 226a, a body 226b, a transfer arm 226c, and a hand 226d. The base 226a may be installed to be movable along the transfer rail 224. The body 226b may be coupled to the base 226a. The body 226b may be provided to be movable along the third direction 16 on the base 226a. The body 226b may be rotatably provided on the base 226a. The transfer arm 226c may be coupled to the body 226b. The transfer arm 226c may be provided to move forward and backward with respect to the body 226b. The transfer arm 226c may include a plurality of transfer arms 226c. A plurality of transfer arms 226c may be individually driven. The plurality of transfer arms 226c may be stacked in a state of being spaced apart from each other along the third direction 16. The plurality of transfer arms 226c may simultaneously transfer the plurality of substrates W to the substrate treating apparatus 300. In an embodiment, the plurality of transfer arms 226c may simultaneously transfer an even number of substrates W to the substrate treating apparatus 300.

The substrate treating apparatus 300 may be coupled to the transfer chamber 222. The plurality of substrate treating apparatuses 300 may be connected to the transfer chamber 222. The plurality of substrate treating apparatuses 300 may be positioned on both side surfaces of the transfer chamber 222. A gate valve may be installed between the transfer chamber 222 and the substrate treating apparatus 300 to open and close a transfer port (not shown) through which the substrate W is taken in and out. A transfer space for transferring the substrate W may be formed inside the transfer chamber 222. The transfer space may be provided in a vacuum environment.

Hereinafter, the substrate treating apparatus 300 according to an embodiment of the inventive concept will be described in detail with reference to the drawings.

Figure 2:
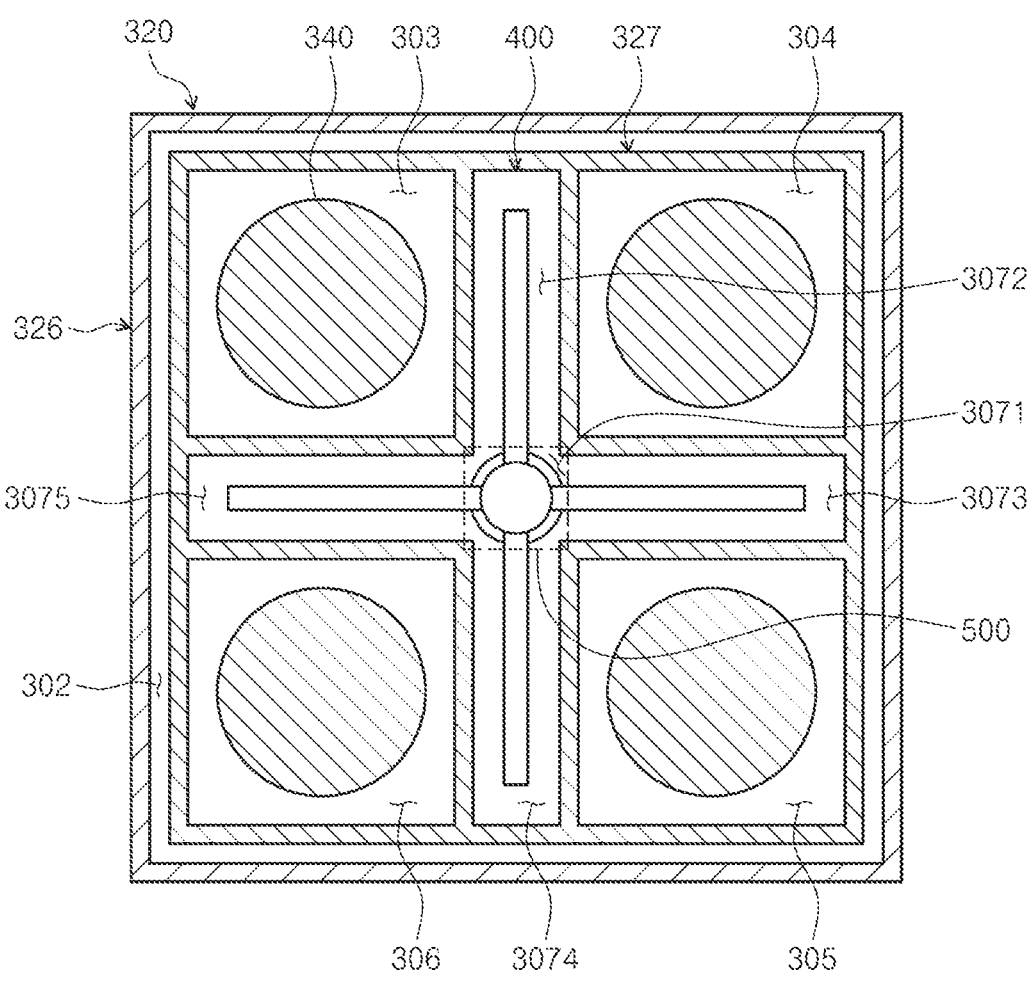
FIG. 2 is a plan cross-sectional view of a substrate treating apparatus according to an embodiment of the inventive concept.
Figure 3:
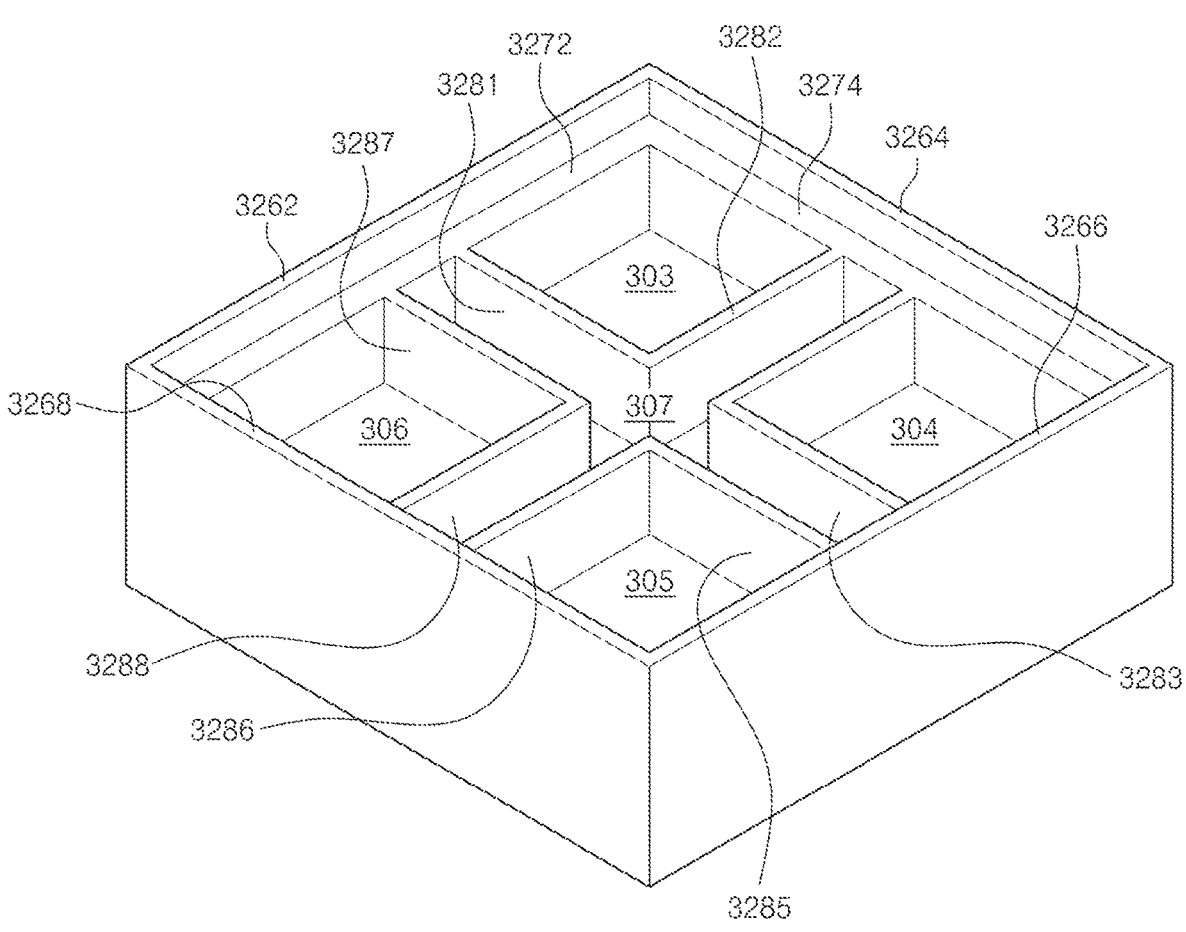
FIG. 3 is a cross-sectional perspective view of a chamber illustrated in FIG. 2.
Figure 5:
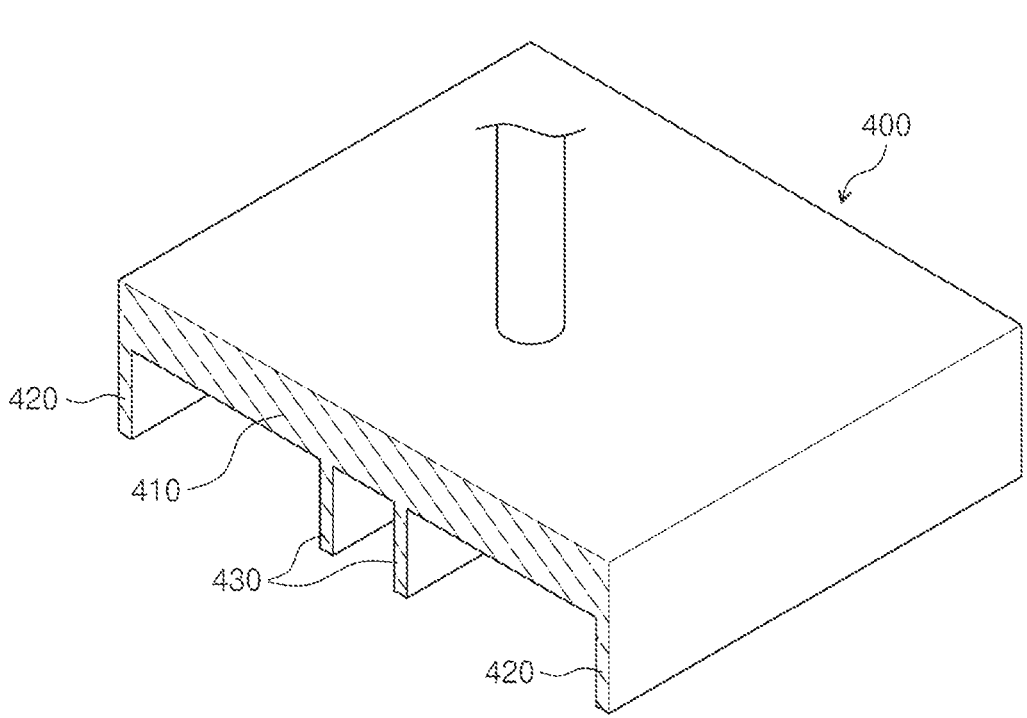
FIG. 5 is a side perspective view of the separation unit illustrated in FIG. 2.
Figure 6:
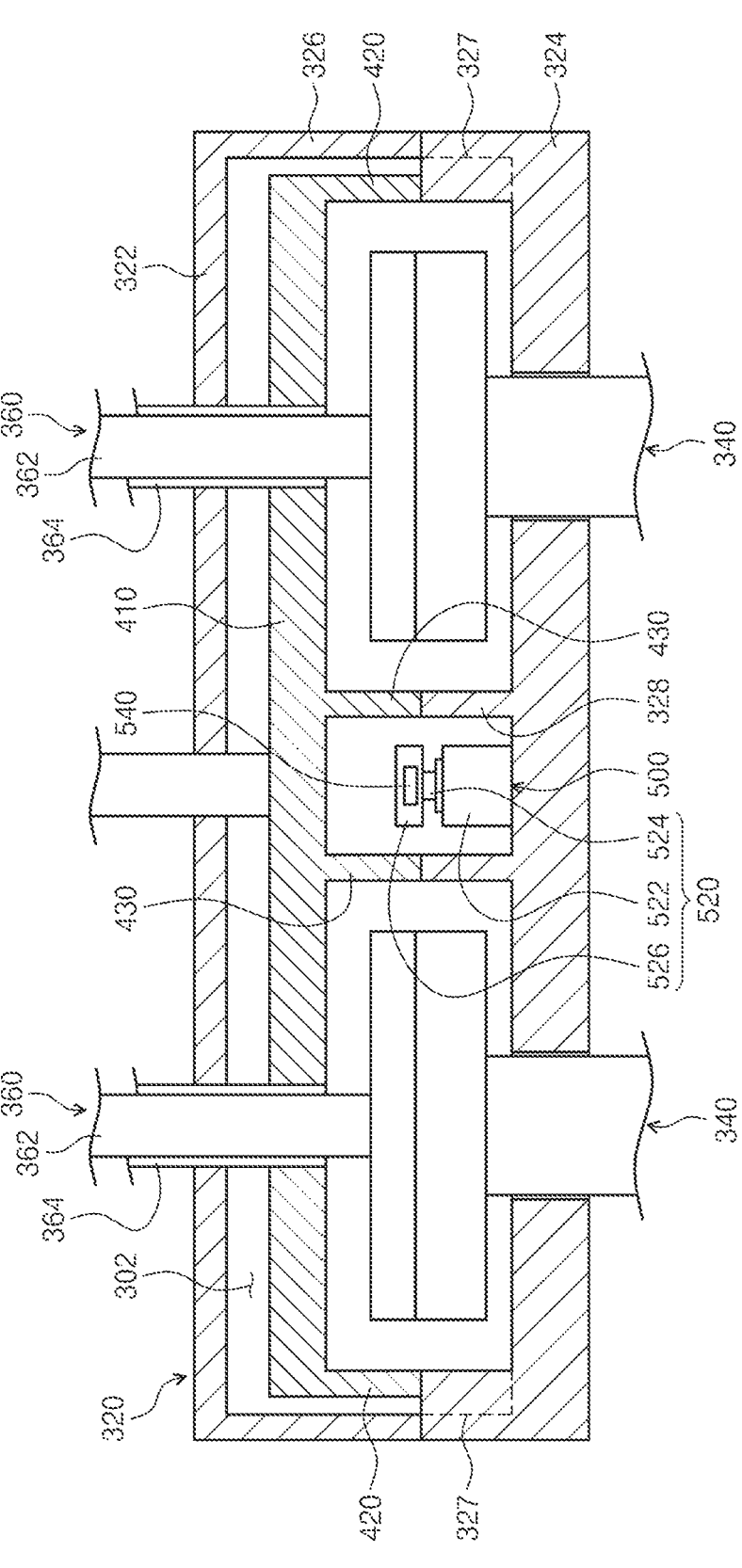
FIG. 6 is a side cross-sectional view schematically illustrating a state in which a treating space of the substrate treating apparatus of FIG. 2 is sealed.
Figure 7:
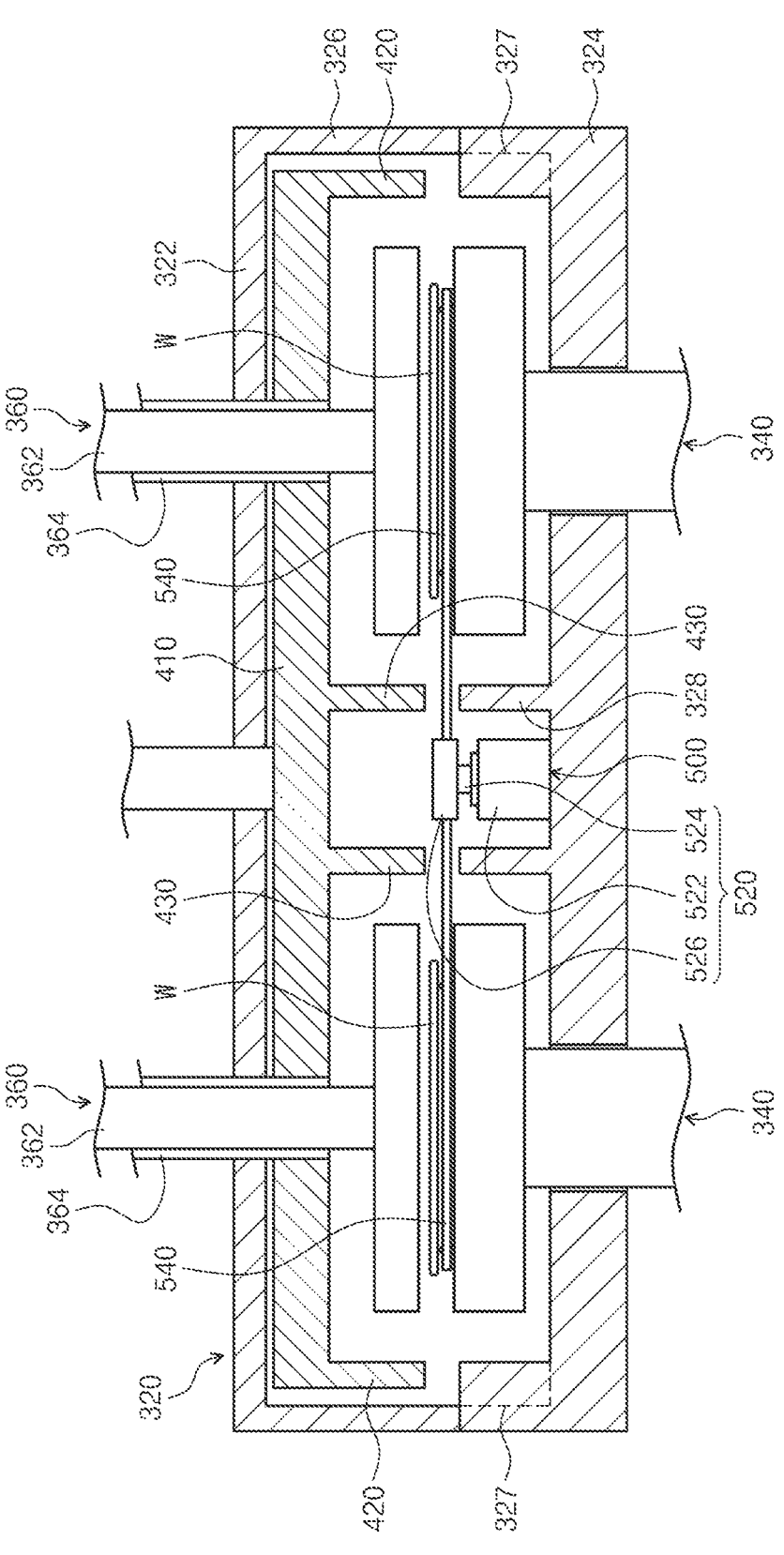
FIG. 7 is a side cross-sectional view schematically illustrating a state in which the treating space of the substrate treating apparatus of FIG. 2 is opened.
Figure 8:
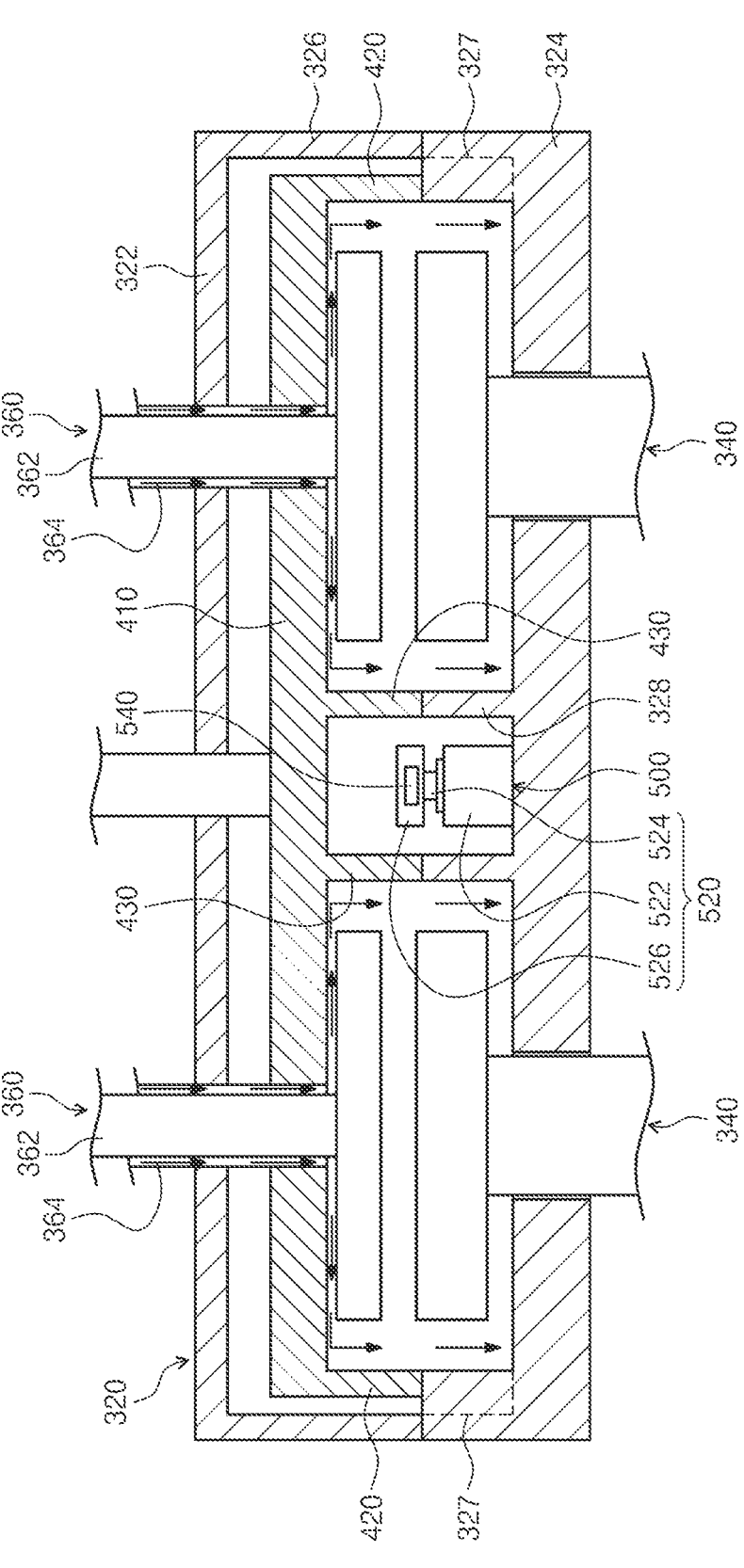
FIG. 8 schematically illustrates illustrating a state in which a substrate treatment process is performed in the substrate treating apparatus according to an embodiment of the inventive concept.
Figure 9:
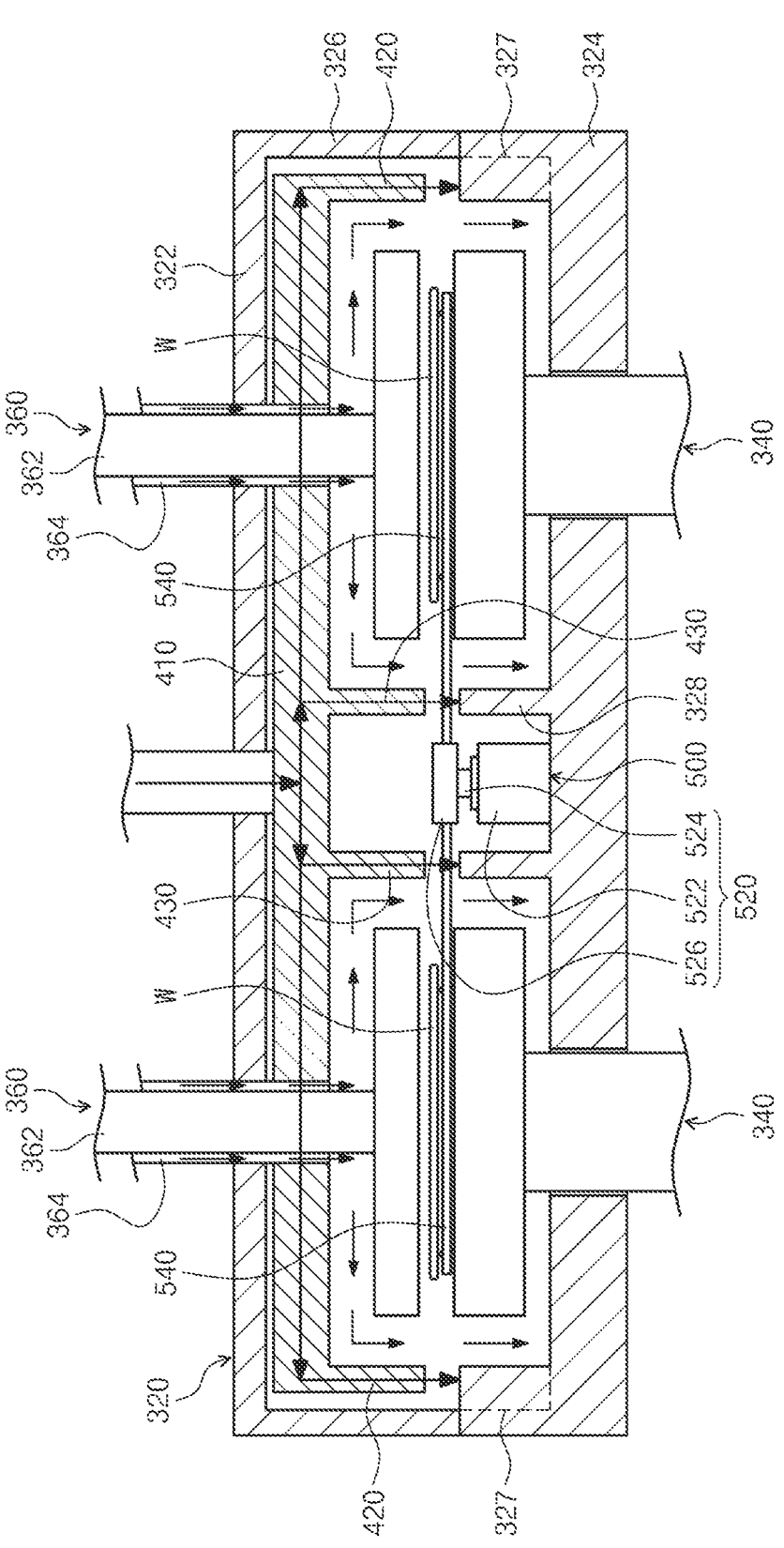
FIG. 9 schematically illustrates illustrating a state in which the substrate treatment process is not performed in the substrate treatment apparatus according to an embodiment of the inventive concept.
Figure 10:
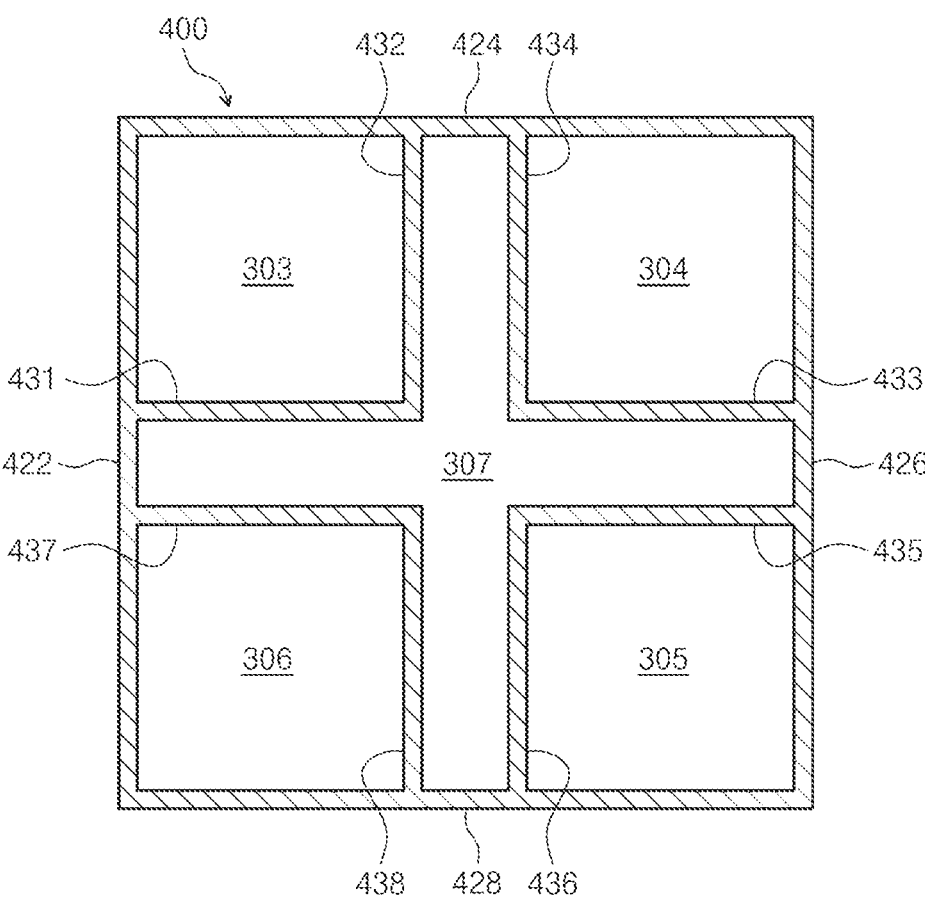
FIG. 10 is a plan view of the separation unit according to an embodiment of the inventive concept.
Figure 16:
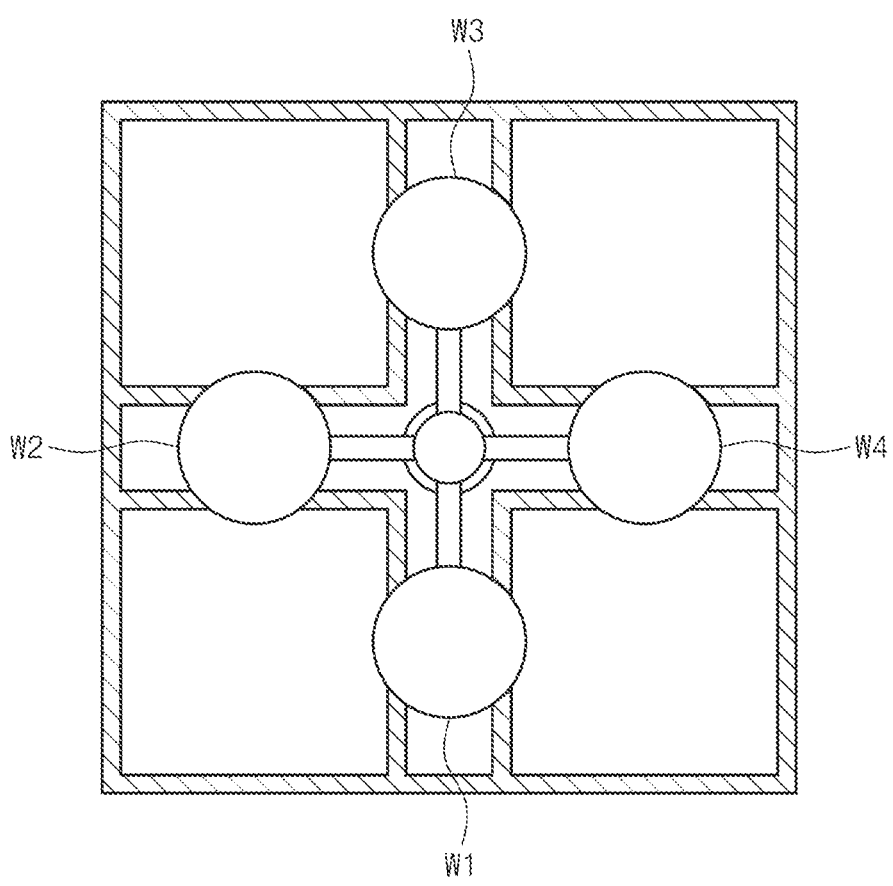
Figure 17:
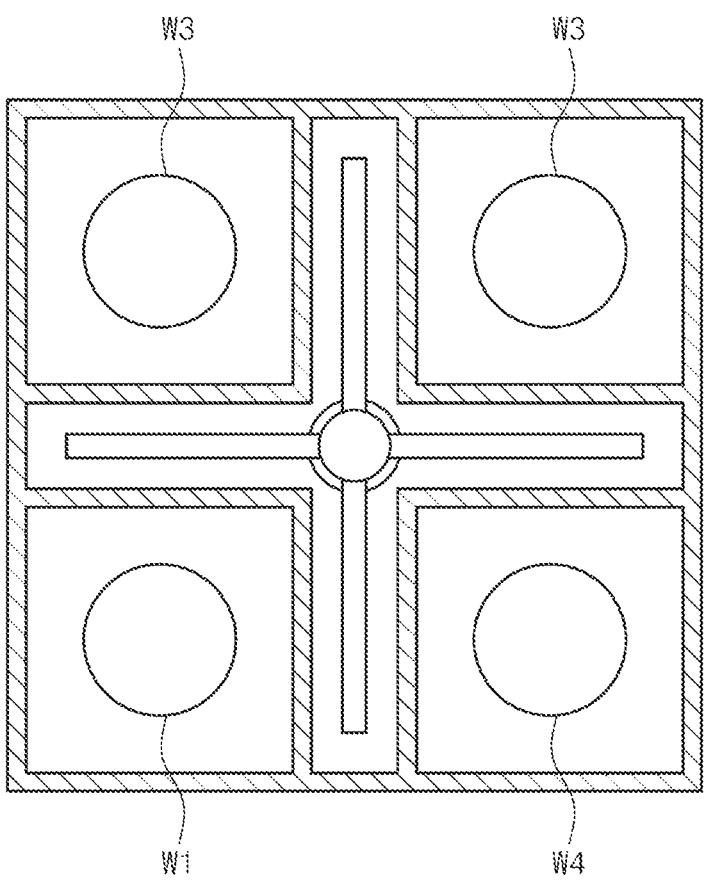
Figure 18:
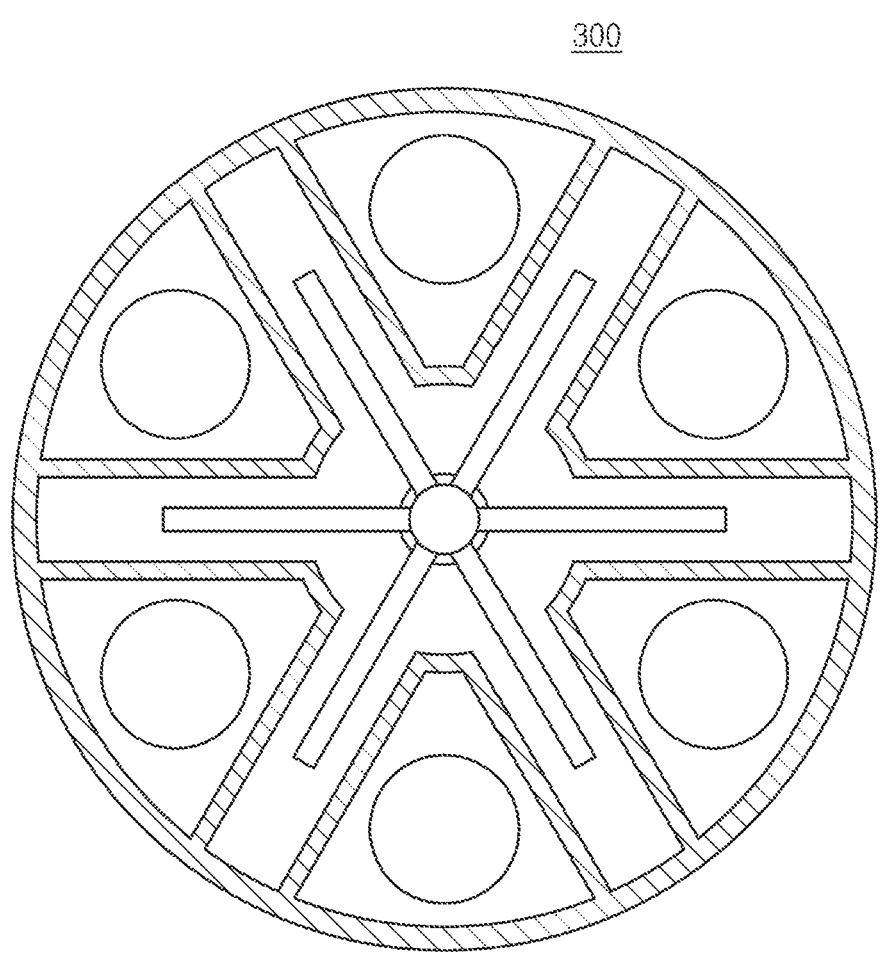
FIG. 18 illustrates a modified embodiment of the substrate treating apparatus of FIG. 2.

FIG. 2 is a cross-sectional view of a substrate treating apparatus according to an embodiment of the inventive concept, FIG. 3 is a cross-sectional perspective view of the chamber illustrated in FIG. 2, FIG. 5 is a cross-sectional perspective view of a separation unit illustrated in FIG. 2, FIG. 6 is a side cross-sectional view schematically illustrating when a treating space of the substrate treating apparatus of FIG. 2 is sealed, FIG. 7 is a side cross-sectional view schematically illustrating when the treating space of the substrate treating apparatus is opened, FIG. 8 schematically illustrates a state when the substrate treatment is performed in the substrate treating apparatus according to an embodiment of the inventive concept, FIG. 9 schematically illustrates a state when the substrate treatment process is not performed in the substrate treatment apparatus according to an embodiment of the inventive concept, FIG. 10 is a schematic view of a separation unit according to an embodiment of the inventive concept, FIG. 11 to FIG. 17 are schematic views of a plurality of substrate treating apparatuses alternately performing a deposition process and an etching processes, and FIG. 18 is a view showing a modified embodiment of the substrate treating apparatus of FIG. 2.

Referring to FIG. 2, the substrate treating apparatus 300 may include a chamber 320. An inner space 302 may be formed therein in the chamber 320. The chamber 320 may store the plurality of substrates W in the inner space 302. A cross section of the chamber 320 may be formed in a rectangular shape. However, the inventive concept is not limited thereto, and may be provided in various shapes capable of accommodating the plurality of substrates W.

A plurality of treating spaces and transfer spaces are formed in the inner space 302 of the chamber 320 as described below, and a plurality of support units 340 supporting the substrate W and a gas supply unit 360 supplying a process gas to the substrate W supported by each of the plurality of support units 340 may be provided. The support unit 340 and the gas supply unit 360 may be provided in a number corresponding to the number of the plurality of treating spaces.

The gas supply unit 360 may include a gas supply line 362 which supplies a process gas and a purge gas supply line 364 installed outside the gas supply line 362. Each of multiple gas supply units 360 may supply different process gases to each treating space in accordance with the type of treatment process which is performed on the substrate W. In an embodiment, the gas supply unit 360 disposed in the treating space in which a deposition process is performed on the substrate may supply a deposition gas to the treating space, and the gas supply unit 360 disposed in the treating space in which an etching process is performed on the substrate may supply an etching gas to the respective treating space. If the treatment process is performed on a plurality of substrates in each treating space, the purge gas supply line 364 may supply a purge gas to the treating space to form an air curtain flow. Accordingly, a downward airflow is formed in the treating space, and each enclosed treating space may be maintained in a clean state. If the separation unit 400 descends to seal the plurality of treating spaces, the purge gas supply line 364 may supply the purge gas to each of the plurality of treating spaces to form the air curtain flow. During the process (if the separation unit 400 descends to seal each treating space), the air curtain flow formed from the purge gas supply line 364 may guide a flow of the reaction gas supplied to each treating space from the gas supply line 362. For example, the flow of the reaction gas may be guided so that the reaction gas is well exhausted to an exhaust pipe (not shown) exhausting each treating space. In addition, since the air curtain flow supplied and formed from the purge gas supply line 364 flows along an outer wall of a stage defining each treating space, it is possible to prevent a contamination of the outer wall of the stage, such as an attaching/adhering of the reaction gas to the outer wall of each stage.

If the separation unit 400 rises to open each treating space (if the process is not performed and the substrate is moved by the transfer unit), the air curtain flow supplied from the purge gas supply line 364 may prevent the reaction gas in each treating space from flowing into the adjacent treating space, just like the air curtain which is supplied and formed from the separation unit 400.

Referring to FIG. 2 and FIG. 3, the chamber 320 may include a top wall 322, a bottom wall 324 disposed opposite the top wall 322, and a plurality of sidewalls 326 connecting the top wall 322 and the bottom wall 324. A transfer port (not shown) through which the substrate W is taken into and/or taken out may be formed in any one sidewall 326 of the plurality of sidewalls 326, and the transfer port may be opened and closed through the gate valve described above. The inner space 302 of the chamber 320 may be formed by combining the top wall 322, the bottom wall 324, and the plurality of sidewalls 236. The plurality of sidewalls 326 may include a first to a fourth sidewall 3262, 3264, 3266, and 3268 adjacent to each other.

The chamber 320 may include a plurality of protruding walls 327 upwardly protruding from the bottom wall 324. The plurality of protruding walls 327 may inwardly protrude from a plurality of sidewalls 326. The plurality of protruding walls 327 may extend along an inner surface of the plurality of sidewalls 326. The plurality of protruding walls 327 may include a first to a fourth protruding wall 3272, 3274, 3276, and 3278. The first protruding wall 3272 may inwardly protrude from the first sidewall 3262. The second protruding wall 3274 may inwardly protrude from the second sidewall 3264. The third protruding wall 3276 may inwardly protrude from the third sidewall 3266. The fourth protruding wall 3278 may inwardly protrude from the fourth sidewall 3268. The first to fourth protruding walls 3272, 3274, 3276, and 3278 may combine to form a rectangular ring having a space formed therein. The plurality of protruding walls 327 may be provided in a number corresponding to the side plate 420 of the separation unit 400 to be described later.

The protruding wall 327 may be provided to have a height lower than that of the sidewall 326. In an embodiment, the protruding wall 327 may be formed to have the same height as the support unit 340 to be described later. Alternatively, the protruding wall 327 may be formed to have a height lower than that of the support unit 340. Accordingly, if the substrate W is transferred by the transfer unit 500 to be described later, an interference or a collision with the protruding wall 327 may be avoided.

The protruding wall 327 may face the side plate 420 of the separation unit 400 to be described later. A top surface of the protruding wall 327 may be spaced apart from the side plate 420 or may contact the side plate 420 as the separation unit 400 moves in the vertical direction. The first protruding wall 3272 may face a first side plate 422, the second protruding wall 3274 may face a second side plate 424, the third protruding wall 3276 may face a third side plate 426, and the fourth protruding wall 3278 may face a fourth side plate 428.

The chamber 320 may include a plurality of partition walls 328 upwardly protruding from the bottom wall 324. The plurality of partition walls 328 may be provided in a number corresponding to a separation plate 430 of the separation unit 400 to be described later. The partition wall 328 may be provided at a height corresponding to the protruding wall 327. The partition wall 328 may be provided at a height corresponding to the support unit 340. Alternatively, the partition wall 328 may be provided at a height lower than that of the support unit 340. Accordingly, if the substrate W is transferred by the transfer unit 500 to be described later, an interference or a collision with the partition wall 328 may be avoided.

The partition wall 328 may face the separation plate 430 of the separation unit 400 to be described later. A top surface of the partition wall 328 may be spaced apart from the separation plate 430 or may contact the separation plate 430 as the separation unit 400 moves in the vertical direction.

The partition wall 328 may include a first partition wall 3281 having an end coupled to the first protruding wall 3272 and a second partition wall 3282 having an end coupled to the second protruding wall 3274 and the other end coupled to the other end of the first partition wall 3281. The first partition wall 3281 may face the second protruding wall 3274. The first partition wall 3281 may be spaced apart from the second protruding wall 3274. The second partition wall 3282 may face the first protruding wall 3272. The second partition wall 3282 may be spaced apart from the first protruding wall 3272. The first protruding wall 3272, the second protruding wall 3274, the first partition wall 3281, and the second partition wall 3282 may be combined to form a first treating space 303.

The first partition wall 3281 may face a first separation plate 431 to be described later, and the second partition wall 3282 may face a second separation plate 432 to be described later. The first partition wall 3281 may contact the first separation plate 431, and the second partition wall 3282 may contact the second separation plate 432, if the separation unit 400 is downwardly moved. The first partition wall 3281 may be separated from the first separation plate 431, and the second partition wall 3282 may be separated from the second separation plate 432, if the separation unit 400 is upwardly moved.

The partition wall 328 may include a third partition wall 3283 having an end coupled to the third protruding wall 3276 and a fourth partition wall 3284 having an end coupled to the second protruding wall 3274 and the other end coupled to the other end of the third partition wall 3283. The third partition wall 3283 may face the second protruding wall 3274. The third partition wall 3283 may be spaced apart from the second protruding wall 3274. The fourth partition wall 3284 may face the third protruding wall 3276. The fourth partition wall 3284 may face the second partition wall 3282. The fourth partition wall 3284 may be spaced apart from the third protruding wall 3276. The second protruding wall 3274, the third protruding wall 3276, the third partition wall 3283, the fourth partition wall 3284 may be combined to form the second treating space 304.

The third partition wall 3283 may face a third separation plate 433 to be described later, and the fourth partition wall 3284 may face a fourth separation plate 434 to be described later. If the separation unit 400 is downwardly moved, the third partition wall 3283 may contact the third separation plate 433, and the fourth partition wall 3284 may contact the fourth separation plate 434. The third partition wall 3283 may be separated from the third separation plate 433, and the fourth partition wall 3284 may be separated from the fourth separation plate 434, if the separation unit 400 is upwardly moved.

The partition wall 328 may include a fifth partition wall 3285 having an end coupled to the third protruding wall 3276 and a sixth partition wall 3286 having an end coupled to the fourth protruding wall 3278 and the other end coupled to the other end of the fifth partition wall 3285. The fifth partition wall 3285 may face the fourth protruding wall 3278. The fifth partition wall 3285 may face the third partition wall 3283. The sixth partition wall 3286 may be spaced apart from the third protruding wall 3276. The sixth partition wall 3286 may face the third protruding wall 3276. The third protruding wall 3276, the fourth protruding wall 3278, the fifth partition wall 3285 and the sixth partition wall 3286 may be combined to form a third treating space 305.

The fifth partition wall 3285 may face the fifth separation plate 435 to be described later in the vertical direction, and the sixth partition wall 3286 may face the sixth separation plate 436 to be described later in the vertical direction. If the separation unit 400 is downwardly moved, the fifth partition wall 3285 may contact the fifth separation plate 435, and the sixth partition wall 3286 may contact the sixth separation plate 436. If the separation unit 400 is upwardly moved, the fifth partition wall 3285 may be separated from the fifth separation plate 435, and the sixth partition wall 3286 may be separated from the sixth separation plate 436.

The partition wall 328 may include a seventh partition wall 3287 having an end coupled to the first protruding wall 3272 and an eighth partition wall 3288 having an end coupled to the fourth protruding wall 3278 and the other end coupled to the other end of the seventh partition wall 3287. The seventh partition wall 3287 may face the fourth protruding wall 3278. The seventh partition wall 3287 may face the first partition wall 3281. The eighth partition wall 3288 may be spaced apart from the first protruding wall 3272. The eighth partition wall 3288 may face the first protruding wall 3272. The first protruding wall 3272, the fourth protruding wall 3278, the seventh partition wall 3287 and the eighth partition wall 3288 may be combined to form a fourth treating space 306.

The seventh partition wall 3287 may face the seventh separation plate 437 to be described later in the vertical direction, and the eighth partition wall 3286 may face the eighth separation plate 438 to be described later in the vertical direction. If the separation unit 400 is downwardly moved, the seventh partition wall 3287 may contact the seventh separation plate 437, and the eighth partition wall 3288 may contact the eighth separation plate 438. The seventh partition wall 3287 may be separated from the seventh separation plate 437, and the eighth partition wall 3288 may be separated from the eighth separation plate 438, if the separation unit 400 is upwardly moved.

Figure 4:
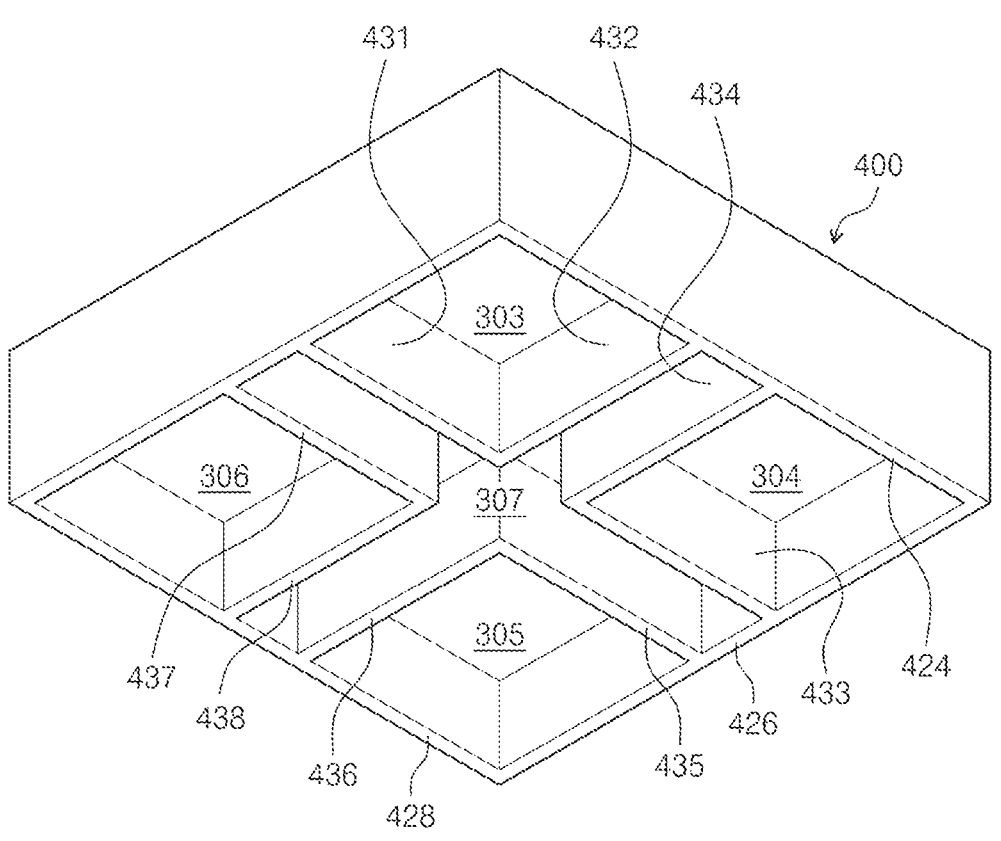
FIG. 4 is a bottom perspective view of a separation unit illustrated in FIG. 2.

Referring to FIG. 2, FIG. 4, and FIG. 5, the substrate treating apparatus 300 may include a separation unit 400. The separation unit 400 may be provided in the inner space 302 of the chamber 320. The separation unit 400 may be combined with the chamber 320 to separate the inner space 302 into a plurality of treating spaces 303 to 306 and a transfer space 307.

The separation unit 400 may include a top plate 410, a side plate 420 downwardly extending from an outer edge of the top plate 410, and a separation plate 430 downwardly extending from the top plate 410.

The top plate 410 may face the top wall 322 of the chamber 320. The top plate 410 may be formed in a shape corresponding to the top wall 322 of the chamber 320. In an embodiment, the top plate 410 may be provided in a rectangular shape. The top plate 410 is provided under the top wall 322 and may be spaced apart from the top wall 322.

The side plate 420 may face the protruding wall 327. The side plate 420 may be provided on the protruding wall 327. The side plate 420 may vertically overlap the protruding wall 327. The side plate 420 may vertically overlap at least a portion of the protruding wall 327. A cross-sectional area of the side plate 420 may be provided as a smaller cross-sectional area than that of the protruding wall 327. An inner surface of the side plate 420 may be positioned on the same plane as the inner surface of the protruding wall 327, and the outer surface of the side plate 420 may be positioned inside the outer surface of the protruding wall 327. The outer surface of the side plate 420 may be positioned inward than the inner surface of the sidewall 326 of the chamber 320. The outer surface of the side plate 420 may be spaced apart from the inner surface of the sidewall 326 of the chamber 320.

The side plate 420 may include a plurality of side plates 420. The plurality of side plates 420 may be provided in a number corresponding to the protruding wall 327 of the chamber 320. In an embodiment, the plurality of side plates 420 may include a first to a fourth side plate 422, 424, 426, and 428. The bottom end of the side plate 420 may contact the protruding wall 327 or may be spaced apart from the protruding wall 327 as the separation unit 400 moves in the vertical direction.

The separation plate 430 may face the partition wall 328. The separation plate 430 may vertically overlap the partition wall 328. The separation plate 430 may be provided on the partition wall 328. The separation plate 430 may be provided inside the side plate 420. The separation plate 430 may include the plurality of separation plates 430. The plurality of separation plates 430 may be provided in a number corresponding to the plurality of partition walls 328.

The plurality of separation plates 430 may include a first separation plate 431 having an end coupled to the first side plate 422 and a second separation plate 432 having an end coupled to the second side plate 424 and the other end coupled to the other end of the first separation plate 431. The first separation plate 431 may face the second side plate 424. The first separation plate 431 may be spaced apart from the second side plate 424. The first separation plate 431 may face the seventh separation plate 437. The first separation plate 431 may be provided on the first partition wall 3281. The first separation plate 431 may vertically overlap the first partition wall 3281. The second separation plate 432 may face the first side plate 422. The second separation plate 432 may be spaced apart from the first side plate 422. The second separation plate 432 may face the fourth separation plate 434. The second separation plate 432 may be spaced apart from the fourth separation plate 434. The second separation plate 432 may be provided on the second partition wall 3282. The second separation plate 432 may vertically overlap the second partition wall 3282. The first side plate 422, the second side plate 424, the first separation plate 431, and the second separation plate 432 may be combined with each other to form a first treating space 303. The first side plate 422, the second side plate 424, the first separation plate 431, and the second separation plate 432, which define the first treating space 303, may be referred to as the first stage. That is, the chamber 320 may mean one entire chamber including a plurality of treating spaces, and may mean a portion defining each treating space separated by the separation unit 400 (the first stage described above).

The plurality of separation plates 430 may include a third separation plate 433 having an end coupled to the third side plate 426, and a fourth separation plate 434 having an end coupled to the second side plate 424 and the other end coupled to the other end of the third separation plate 433. The third separation plate 433 may face the second side plate 424. The third separation plate 433 may be spaced apart from the second side plate 424. The third separation plate 433 may face the fifth separation plate 435. The third separation plate 433 may be spaced apart from the fifth separation plate 435. The third separation plate 433 may be provided on the third partition wall 3283. The third separation plate 433 may vertically overlap the third partition wall 3283. The fourth separation plate 434 may face the third side plate 426. The fourth separation plate 434 may be spaced apart from the third side plate 426. The fourth separation plate 434 may face the second separation plate 432. The fourth separation plate 434 may be spaced apart from the second separation plate 432. The fourth separation plate 434 may be provided on the fourth partition wall 3284. The fourth separation plate 434 may vertically overlap the fourth partition wall 3284. The second side plate 424, the third side plate 426, the third separation plate 433, and the fourth separation plate 434 may be combined with each other to form a second treating space 304. The second side plate 424, the third side plate 426, the third separation plate 433, and the fourth separation plate 434, which define the second treating space 302, may be referred to as a second stage. That is, the chamber 320 may mean one entire chamber including a plurality of treating spaces, and may mean a portion defining each treating space separated by the separation unit 400 (the second stage described above).

The plurality of separation plates 430 may include a fifth separation plate 435 having an end coupled to the third side plate 426, and a sixth separation plate 436 having an end coupled to the fourth side plate 428 and the other end coupled to the other end of the fifth separation plate 435. The fifth separation plate 435 may face the fourth side plate 428. The fifth separation plate 435 may be spaced apart from the fourth side plate 428. The fifth separation plate 435 may face the third separation plate 433. The fifth separation plate 435 may be spaced apart from the third separation plate 433. The fifth separation plate 435 may be provided on the fifth partition wall 3285. The fifth separation plate 435 may vertically overlap the fifth partition wall 3285. The sixth separation plate 436 may face the third side plate 426. The sixth separation plate 436 may be spaced apart from the third side plate 426. The sixth separation plate 436 may face the eighth separation plate 438. The sixth separation plate 436 may be spaced apart from the eighth separation plate 438. The sixth separation plate 436 may be provided on the sixth partition wall 3286. The sixth separation plate 436 may vertically overlap the sixth partition wall 3286. The third side plate 426, the fourth side plate 428, the fifth separation plate 435, and the sixth separation plate 436 may be combined with each other to form a third treating space 305. The third side plate 426, the fourth side plate 428, the fifth separation plate 435, and the sixth separation plate 436 defining the third treating space 305 may be referred to as a third stage. That is, the chamber 320 may mean one entire chamber including a plurality of treating spaces, and may mean a portion defining each treating space separated by the separation unit 400 (the third stage described above).

The plurality of separation plates 430 may include a seventh separation plate 437 having an end coupled to the first side plate 422 and an eighth separation plate 438 having an end coupled to the fourth side plate 428 and the other end coupled to the other end of the seventh separation plate 437. The seventh separation plate 437 may face the fourth side plate 428. The seventh separation plate 437 may be spaced apart from the fourth side plate 428. The seventh separation plate 437 may face the first separation plate 431. The seventh separation plate 437 may be spaced apart from the first separation plate 431. The seventh separation plate 437 may be provided on the seventh partition wall 3287. The seventh separation plate 437 may vertically overlap the seventh partition wall 3287. The eighth separation plate 438 may face the first side plate 422. The eighth separation plate 438 may be spaced apart from the first side plate 422. The eighth separation plate 438 may face the sixth separation plate 436. The eighth separation plate 438 may be spaced apart from the sixth separation plate 436. The eighth separation plate 438 may be provided on the eighth partition wall 3288. The eighth separation plate 438 may vertically overlap the eighth partition wall 3288. The fourth side plate 428, the first side plate 422, the seventh separation plate 437, and the eighth separation plate 438 may be combined with each other to form a fourth treating space. The fourth side plate 428, the first side plate 422, the seventh separation plate 437, and the eighth separation plate 438, which define the fourth treating space 306, may be referred to as the fourth stage. That is, the chamber 320 may mean one entire chamber including a plurality of treating spaces, and may mean a portion defining each treating space separated by the separation unit 400 (the fourth stage described above). That is, the chamber 320 may mean an entire chamber including a first to a fourth stage or may mean each of the first to fourth stages.

Referring to FIG. 6 and FIG. 7, the separation unit 400 may be provided to be movable in a vertical direction in the inner space 302. The separation unit 400 may be vertically moved in the inner space 302 by a driving unit (not shown). The driving unit (not shown) may include a motor. The separation unit 400 may be provided movable between a contact position at which the separation plate 430 contacts the partition wall 328 and a separation position at which the separation plate 430 is spaced apart from the partition wall 328. The separation unit 400 may be provided movable between a contact position at which the side plate 420 contacts the protruding wall 327 and a separation position at which the side plate 420 is spaced apart from the protruding wall 327. The separation unit 400 seals the treating space at the contact position and opens the treating space at the separation position.

Referring to FIG. 8, if the separation unit 400 is positioned at the contact position and each treating space is sealed, a set substrate treatment process is performed in each treating space. In this case, the gas supply line 362 supplies a process gas used in the set substrate treatment process to each treating space. In addition, a purge gas supply line 364 can maintain each treating space in a clean state by supplying a purge gas (comprising the process gas) to each treating space to form a downward airflow. In addition, a air curtain flow is formed in each treating space due to the purge gas, and the process gas can be prevented from flowing into other treating spaces through a fine gap between the separation unit 400 and the chamber 320 through the air curtain flow.

Referring to FIG. 9, the separation unit 400 may include a purge gas supply unit 440. The purge gas supply unit 440 may include a purge gas supply line 442 and a purge gas supply source 444 supplying the purge gas to the purge gas supply line 442. The purge gas supply line 442 may be embedded in the top plate 410, a plurality of side plates 420, and a plurality of separation plates 430. The purge gas supply source 444 may supply the purge gas to the purge gas supply line 442. The purge gas may be provided as an inert gas such as an nitrogen gas $N_2$, an argon gas Ar, or the like. A discharge port of the purge gas supply line 442 may be formed at an end of each of the plurality of side plates 420 and an end of each of the plurality of separation plates 430. The purge gas supply unit 440 may supply the purge gas through an outlet of the purge gas supply line 442 if the separation unit 400 is positioned at a separation position. In this case, the supplied purge gas may form an air curtain. Accordingly, even if the separation unit 400 chamber 320 is separated from the plurality of protruding walls 327 and the plurality of partition walls 328, the plurality of treating spaces and transfer spaces can be maintained in a separated state by the air curtain. Accordingly, it is possible to prevent the process gas used in each treating space from being mixed. In addition, it is possible to prevent by-products and foreign substances generated after treatment in each treating space from flowing into other treating spaces or transfer spaces.

Referring to FIG. 2 to FIG. 5, the inner space 302 of the chamber 320 may include a plurality of treating spaces and a transfer space. The plurality of treating spaces and transfer spaces may be separated as the separation unit 400 is positioned at the contact position. In an embodiment, the plurality of treating spaces may include a first to a fourth treating space. The first treating space 303 is separated from other spaces by contact with a part of the chamber 320 including the first protruding wall 3272, the second protruding wall 3274, the first partition wall 3281 and the second partition wall 3282, and a part of the separation unit 400 including the first side plate 422, the second side plate 424, the first separation plate 431 and the second separation plate 432. The first treating space 303 is separated from other spaces by contact with a part of the chamber 320 including the second protruding wall 3274, the third protruding wall 3276, the third partition wall 3283 and the fourth partition wall 3284, and a part of the separation unit 400 including the second side plate 424, the third side plate 426, the third separation plate 434, and the fourth separation plate 434. The third treating space 305 is separated from other spaces by contact with a portion of the chamber 320 including the fourth protruding wall 3278, the first protruding wall 3272, the seventh partition wall 3287 and the eighth partition wall 328 and the fourth side plate 428, the first side plate 422, the seventh separation plate 437. The fourth treating space 306 is separated from other spaces by contact with parts of the chamber 320 including the third protruding wall 3276, the fourth protruding wall 3278, the fifth partition wall 3285 and the sixth partition wall 3286, and the third side plate 426, the fourth side plate 428, the fifth separation plate 435, and the sixth separation plate 436.

The transfer space 307 is formed between the first to the fourth treating spaces 303 to 306. The transfer space 307 may include a central area 3071, a first region 3072 between the first treating space 303 and the second treating space 304, a second region 3073 between the second treating space 304 and the third treating space 306, and a third region 3074 between the third treating space 305 and the fourth treating space 306, and a fourth region 3075 between the fourth treating space 306 and the first treating space 303.

The transfer unit 500 may be provided in the transfer space 307. The transfer unit 500 may transfer the substrate W when the separation unit 400 is positioned at a separation position. The transfer unit 500 may transfer a plurality of substrates W taken into each of a plurality of treating spaces between a plurality of treating spaces. The transfer unit 500 may transfer the substrate W, which has been taken into each of the plurality of treating spaces and fully treated, to an adjacent treating space. The transfer unit 500 may simultaneously transfer the plurality of substrates W taken in each of the plurality of treating spaces. The transfer unit 500 may simultaneously transfer the plurality of substrates W in a clockwise or counterclockwise direction.

The transfer unit 500 may include a central part 520 installed in a central region of the transfer space, and a plurality of arms 540 outwardly extending from the central part 520 and supporting the substrate W. The central part 520 may be rotatably provided. The central part 520 may be provided to be rotatable at a predetermined angle. The central part 520 may include a base 522, a rotation shaft 524 rotatably coupled to the base 522, and a body 526 coupled to the rotation shaft 524 and rotating with the rotation shaft 524. The plurality of arms 540 are coupled to the body 526, and may be rotated together as the body 526 is rotated.

The plurality of arms 540 are provided in a number corresponding to the number of the plurality of treating spaces. In an embodiment, if a plurality of treating spaces include four treating spaces, the plurality of arms 540 may include four arms. If the plurality of treating spaces include six treating spaces, the plurality of arms 540 may include six arms. Hereinafter, an embodiment in which the plurality of arms 540 include four arms will be described.

The plurality of arms 540 may include a first to a fourth arm 542, 544, 546, and 548. The plurality of arms 540 may be spaced apart from each other. The first arm 542 may extend from the central part 520 to the first region of the transfer space, the second arm 544 may extend from the central part 520 to the second region of the transfer space, the third arm 546 may extend from the central part 520 to the fourth region of the transfer space. The first arm 542 may transfer the substrate between the first treating space 303 and the second treating space 304. The second arm 544 may transfer the substrate between the second treating space 304 and the third treating space 305. The third arm 546 may transfer the substrate between the third treating space 305 and the fourth treating space 306. The fourth arm 458 may transfer the substrate between the fourth treating space 306 and the first treating space 303.

The plurality of arms 540 may be provided with hands (not shown) supporting the substrate W. The hand may adsorb and support the substrate W.

Hereinafter, a substrate treating method according to an embodiment of the inventive concept will be described in more detail with reference to the drawings.

FIG. 11 to FIG. 17 schematically illustrate a state in which a deposition process and an etching process are alternately performed on a plurality of substrates in the substrate treating apparatus of FIG. 2.

Figure 11:
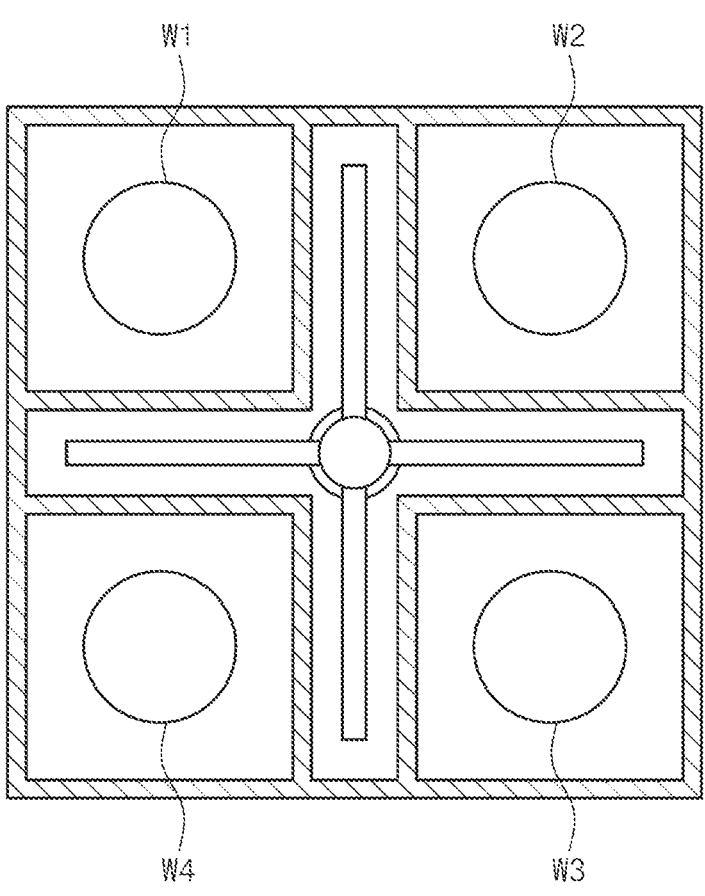
FIG. 11 to FIG. 17 schematically illustrate a state in which a deposition process and an etching process are alternately carried out on a plurality of substrates in the substrate treating apparatus of FIG. 2.
Figure 12:
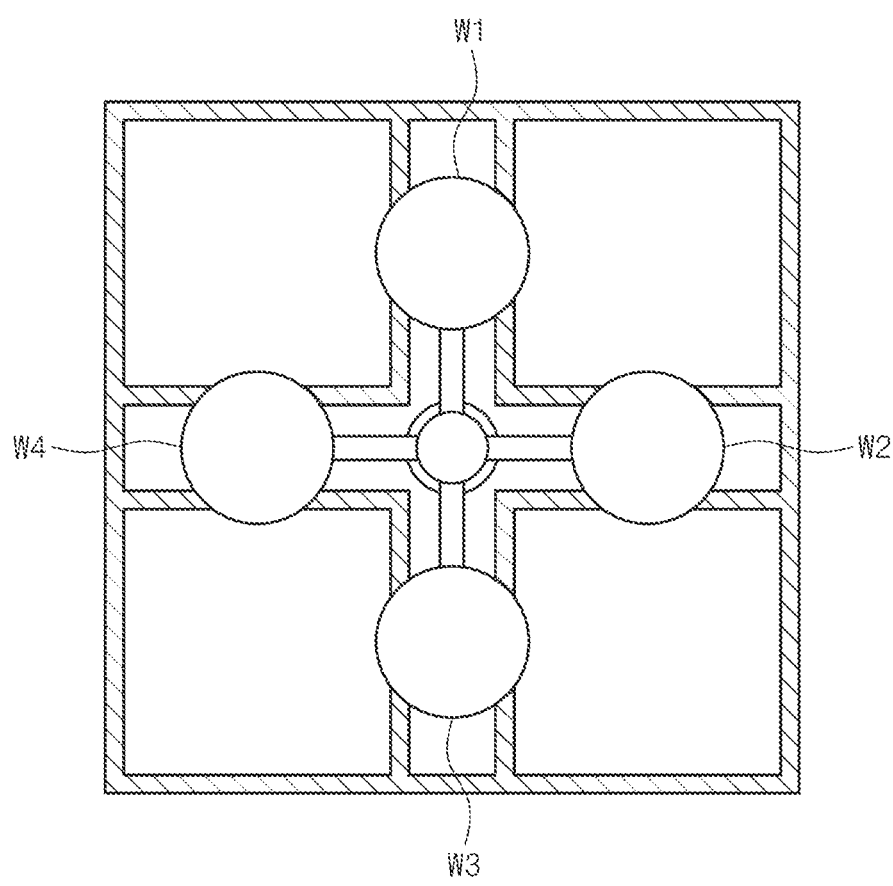
Figure 13:
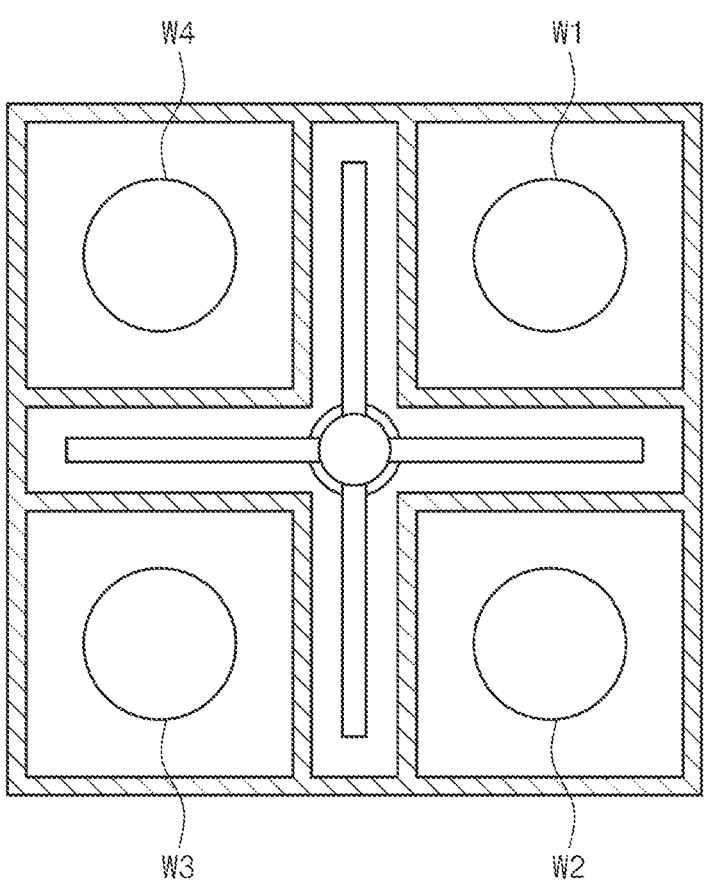
Figure 14:
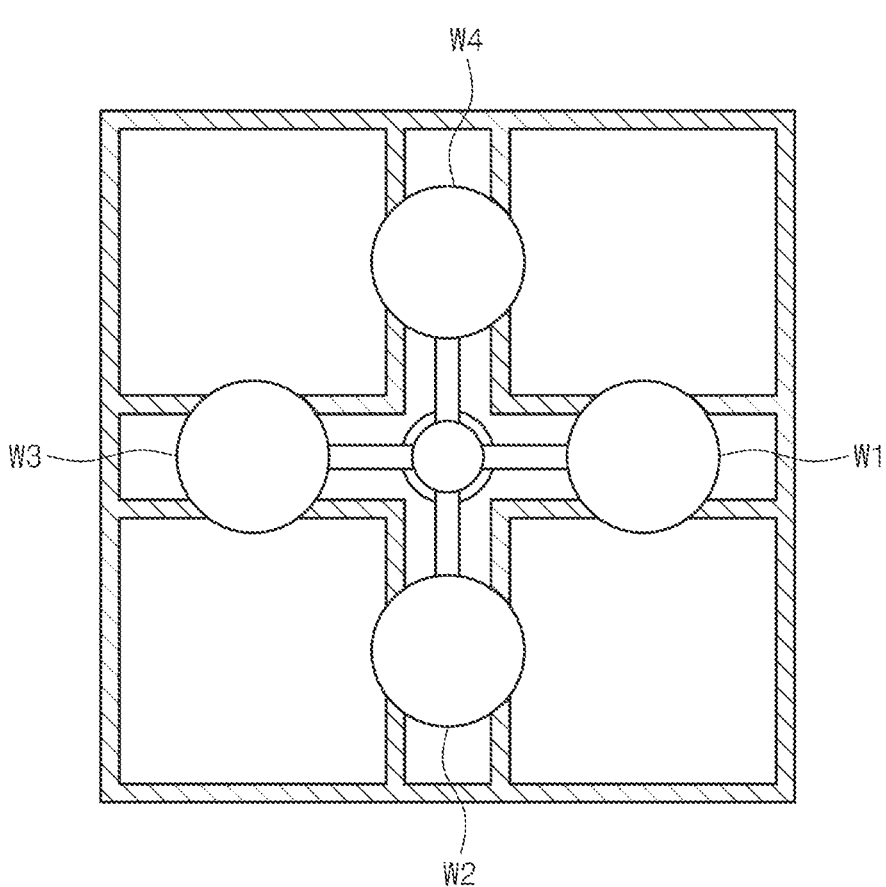
Figure 15:
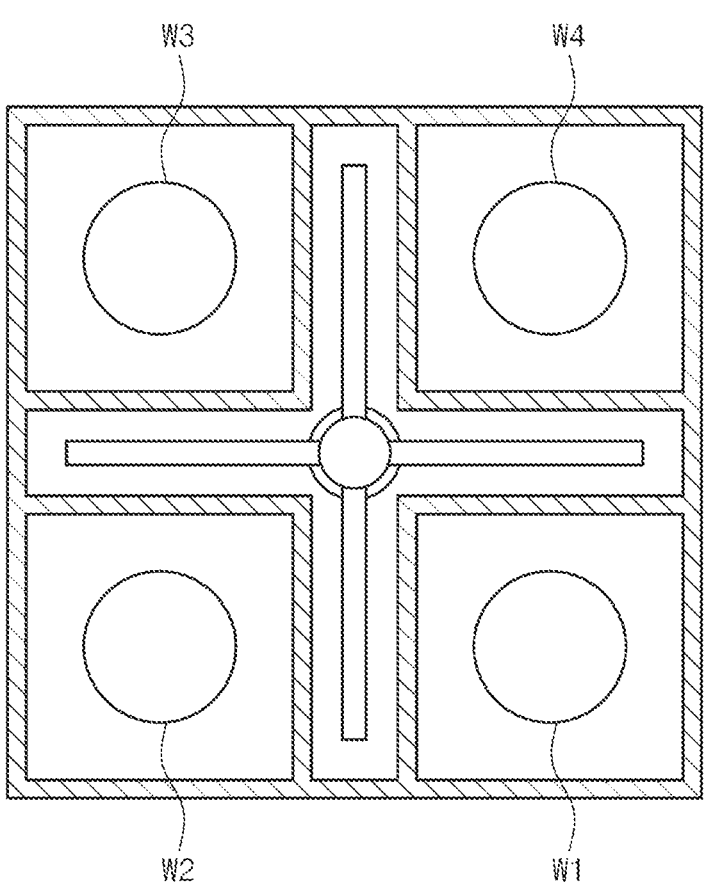

FIG. 11 to FIG. 17 schematically illustrate a process in which one cycle process is performed on a substrate taken into each of a plurality of substrate treating spaces. FIG. 11 illustrates a state the substrate is taken into each of the plurality of substrate treating spaces, FIG. 12 to FIG. 13 illustrates a process of the substrate being transferred to an adjacent treating space after the substrate treatment process is performed in FIG. 11, FIG. 14 and FIG. 15 illustrate a process in which the substrate is transferred to an adjacent treating space after the substrate treatment process is performed in FIG. 13, and FIG. 16 and FIG. 17 illustrate a process in which the substrate is transferred to an adjacent treating space after the substrate treatment process is performed in FIG. 15. The substrate on which the cycle process is completed is then taken out to the transport unit 240.

Different processes may be performed in each of the first to fourth treating spaces 303 to 306. Different processes having different process temperature conditions may be performed in each of the first to fourth treating spaces 303 to 306. Different processes may be performed in any one of the first to fourth treating spaces 303 to 306 and the other one of the first to fourth treating spaces 303 to 306. Different processes may be performed in neighboring spaces among the first to fourth treating spaces 303 to 306. In an embodiment, a deposition process may be performed in the first treating space 303 and the third treating space 305, and an etching process may be performed in the second treating space 304 and the fourth treating space 306. In another embodiment, the etching process may be performed in the first treating space 303 and the third treating space 305, and the deposition process may be performed in the second treating space 304 and the fourth treating space 306.

Referring to FIG. 11 to FIG. 17, the plurality of substrates W are taken into each of the first to fourth treating spaces 303 to 306, and the plurality of substrates W introduced into each of the first to fourth treating spaces 303 to 306 are simultaneously treated. The etching process and the deposition process is alternately performed while the substrate W is sequentially moved in the plurality of treating spaces. In an embodiment, the first substrate W1 taken into the first treating space 303 is transferred to the second treating space 304 by the transfer unit 500 after the deposition process is performed in the first treating space 303, the first substrate W1 is then transferred the third treating space 305 by the transfer unit 500 after the etching process is performed in the second treating space 304, then the first substrate W1 is transferred to the fourth treating space 306 by the transfer unit 500 after the deposition process is performed at the third treating space 305. That is, the first substrate W1 is sequentially transferred to the first to fourth treating spaces 303 to 306 while the deposition process and the etching process are repeated, and when the final process is completed, it is taken out to the transfer unit 240. Similarly, the second substrate W2 taken into the second treating space 304 is sequentially transferred to the second treating space 304, the third treating space 305, the fourth treating space 306, and the first treating space 303 and treated in each space. The third substrate W3 taken into the third treating space 305 is sequentially transferred to the third treating space 305, the fourth treating space 306, the first treating space 303, and the second treating space 304 and treated in each space. The fourth substrate W4 taken into the fourth treating space 306 is sequentially transferred to the fourth treating space 306, the first treating space 303, the second treating space 304, and the third treating space 305. A plurality of substrates W taken into the first to fourth treating spaces 303 to 306 may perform a plurality of circuit treatment processes in the first to fourth treating spaces 303 to 306 according to a process recipe. That is, the cycle process may be performed on the substrate W, and the cycle count may be set differently according to the treatment purpose.

The substrate W taken in each of the first to fourth treating spaces 303 to 306 may be simultaneously treated. If the substrate treatment process is simultaneously performed in the first to fourth treating spaces 303 to 306 at the same time, the separation unit 400 can be positioned at a contact position. If the substrate treatment process performed in the first to fourth treating spaces 303 to 306 is completed, the separation unit 400 may move to a separation position, and the transfer unit 500 may transfer the substrate W to an adjacent treating space.

As an example, four treating spaces are formed in the substrate treating apparatus 300 to simultaneously perform a substrate treatment process on four substrates. However, the plurality of treating spaces may be provided in various numbers according to conditions such as a process efficiency and a footprint. In an embodiment, the plurality of treating spaces may be provided as even spaces. In an embodiment, referring to FIG. 16, the substrate treating apparatus 300 may have a chamber having six treating spaces.

Meanwhile, the substrate treating apparatus and the substrate treating method according to the above-described embodiments may be controlled and performed by a controller (not shown). A configuration, storage, and management of the controller can be realized in the form of a hardware, a software, or a combination of the hardware and the software. The controller's file data and/or software can be optically or magnetically stored on a volatile or a non-volatile storage device such as a Read Only Memory (ROM), or for example a memory such as a Random Access Memory (RAM), a memory chip, a device, or an integrated circuit, such as a compact disk (CD), a DVD (Digital Viable Disc), a magnetic disk or a magnetic tape. Also, it may be simultaneously stored in a machine (for example, a computer) which can read the stored data.

An embodiment of the inventive concept provides a substrate treating apparatus capable of simultaneously performing a deposition process and an etching process. A difficulty of the substrate treating apparatus which combines the deposition process and the etching process to form a pattern is that a temperature of each process is different in most cases, so the temperature must be changed every time a conversion is made between the deposition process and etching process. An embodiment of the inventive concept separates a treating space in which the deposition process is performed and the treating space in which the etching process is performed in the same chamber without a temperature change, and physically separates the treating space in which each process is performed. At the same time, the separation unit 400 can minimize a possibility of a contamination by a process by protecting the transfer unit 500 which moves the plate inside the chamber in a separated (closed) transfer region during the process.

In the embodiment of the inventive concept, a support unit performing each of a deposition process and an etching process exist in the same chamber, so there is no need to change the temperature, and each support unit and transfer unit can be physically separated during the processes to minimize contamination problems through a movable separation unit 400. In addition, if the transfer unit transfers the substrate in the chamber, the separation unit 400 moves the substrate to the next support unit in a state at which the substrate can be moved between each support unit in the chamber. At this time, if the separation unit is lifted, a purge gas is supplied to the treating space through pipes or passages positioned inside the separation unit to prevent a gas and byproducts used for the deposition process and the etching process from entering and mixing with the nearby support unit.

The effect obtained through the configuration of the inventive concept is to prevent thermal shock of components due to temperature change and reduce process time because a stage in which deposition and etching are separated is not required. And since the entire chamber is isolated during the process, the process of opening and closing the chamber door for substrate transfer can be omitted, so that the inner environment of the chamber does not change during the process. Therefore, the optimal process condition may be maintained throughout the process.

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. A substrate treating apparatus comprising:
a chamber having an inner space and including a top wall, a bottom wall opposite the top wall, a plurality of side walls connecting the top wall and the bottom wall, a protruding wall protruding upward from the bottom wall, and a plurality of partition walls;
a separation unit provided at the inner space and including a top plate, a plurality of side plates extending downwardly from an edge of an outer side of the top plate and facing the protruding wall, and a separation plate extending downwardly from the top plate and facing a partition wall of the plurality of partition walls, the separation unit configured to divide the inner space into a plurality of treating spaces and a transfer space;
a plurality of support units provided at each of the plurality of treating spaces and configured to support a substrate;
a plurality of gas supply units provided at each of the plurality of treating spaces and configured to supply a process gas to the substrate supported on the plurality of support units; and
a transfer mechanism provided at the transfer space and configured to transfer the substrate between the plurality of treating spaces.

2. The substrate treating apparatus of claim 1, wherein the separation unit is provided to be movable in an up/down direction within the inner space, and the separation unit is movable between a contact position in which the separation plate of the separation unit contacts the partition wall of the plurality of partition walls of the chamber and a separation position which separates the separation plate of the separation unit from the partition wall of the plurality of partition walls of the chamber.

3. The substrate treating apparatus of claim 2, wherein the separation unit separates the inner space into the plurality of treating spaces and the transfer space at the contact position.

4. The substrate treating apparatus of claim 2, wherein the separation unit further includes a purge gas supply line embedded in the plurality of side plates the separation plate, and a gas supply source supplying a purge gas to the purge gas supply line; and wherein a discharge port of the purge gas supply line is formed at an end of the plurality of side plates and an end of the separation plate, and wherein an air curtain is formed by a supply of the purge gas from the discharge port, if the separation plate is positioned at the separation position.

5. The substrate treating apparatus of claim 2, wherein the transfer space is formed between the plurality of treating spaces, and
the transfer space transfers a substrate which has been treated in each of the plurality of treating spaces in a state at which the separation unit is positioned in the separation position to another treating space in a clockwise direction or in a counter clockwise direction.

6. The substrate treating apparatus of claim 1, wherein the plurality of side plates of the separation unit includes a first to a fourth side plate which are adjacent to each other, and wherein the separation plate of the separation unit includes:
a first separation plate having an end which combines with the first side plate;
a second separation plate having an end which combines with the second side plate and the other end which combines with the other end of the first separation plate;
a third separation plate having an end which combines with the third side plate; and
a fourth separation plate having an end which combines with the second plate and the other which combines with the other end of the third separation plate, and which is spaced apart from the second separation plate, and
wherein the plurality of treating spaces includes a first treating space and a second treating space which are spaced apart, and
wherein the first treating space is formed in a combination of the first side plate, the second side plate, the first separation plate, and the second separation plate, and
the second treating space is formed in a combination of the second side plate, the third side plate, the third separation plate, and the fourth separation plate.

7. The substrate treating apparatus of claim 6, wherein different substrate treatment processes are performed at the first treating space and the second treating space, and
wherein any one process among a deposition process and an etching process is performed at the first treating space, and
the other one process among the deposition process and the etching process is performed at the second treating space.

8. The substrate treating apparatus of claim 6, wherein the first treating space and the second treating space are positioned to be provided alternately.

9. The substrate treating apparatus of claim 6, wherein the separation plate of the separation unit comprises:
a fifth separation plate having an end which combines with the third side plate and is spaced apart from the third separation plate;
a sixth separation plate having an end which combines with the fourth side plate and having the other end combining with the other end of the fifth separation plate;
a seventh separation plate having an end which combines with the first side plate and is spaced apart from the first separation plate; and
an eighth separation plate having an end which combines with the fourth side plate and having the other end combining with the other end of the seventh plate, and which is spaced apart from the sixth separation plate, and wherein the plurality of treating spaces further comprise a third treating space which is formed by the third side plate, the fourth side plate, the fifth separation plate, and the sixth separation plate, and a fourth treating space which is formed by the fourth side plate, the first side plate, the seventh separation plate, and the eighth separation plate.

10. The substrate treating apparatus of claim 1, wherein a plurality of substrates are taken into the plurality of treating spaces, and different substrate treatment processes are simultaneously performed at the plurality of treating spaces.

11. The substrate treating apparatus of claim 1, wherein the plurality of treating spaces includes four treating spaces, and the transfer space is formed between the plurality of treating spaces.

12. The substrate treating apparatus of claim 1, wherein processes having a different process temperature from each other are simultaneously performed at the plurality of treating spaces.

13. The substrate treating apparatus of claim 1, wherein the transfer mechanism comprises:

a central part at which a rotation shaft is combined; and a plurality of arms which extend from the central part to an outside and which support the substrate, and wherein the plurality of arms are provided in a number corresponding to the plurality of treating spaces.

* * * * *